(12) United States Patent
David et al.

(10) Patent No.: US 7,409,260 B2
(45) Date of Patent: Aug. 5, 2008

(54) SUBSTRATE THICKNESS MEASURING DURING POLISHING

(75) Inventors: Jeffrey Drue David, San Jose, CA (US);
Dominic J. Benvegnu, La Honda, CA (US); Harry Q. Lee, Los Altos, CA (US); Boguslaw A. Swedek, Cupertino, CA (US); Lakshmanan Karuppiah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/748,825

(22) Filed: May 15, 2007

(65) Prior Publication Data

US 2007/0224915 A1    Sep. 27, 2007

Related U.S. Application Data

(63) Continuation-in-part of application No. 11/213,344, filed on Aug. 26, 2005.

(60) Provisional application No. 60/747,768, filed on May 19, 2006, provisional application No. 60/710,682, filed on Aug. 22, 2005.

(51) Int. Cl.
*G06F 19/00* (2006.01)
*H01L 21/00* (2006.01)
*B24B 49/00* (2006.01)

(52) U.S. Cl. .......... 700/160; 700/108; 700/121; 700/175; 438/7; 451/5; 451/6

(58) Field of Classification Search ............ 700/121, 700/160, 164, 174, 175, 108–110; 438/5, 438/7–9, 16; 451/5, 6, 8, 287, 288; 382/152
See application file for complete search history.

(56) References Cited

U.S. PATENT DOCUMENTS

| | | | |
|---|---|---|---|
| 5,747,380 | A | 5/1998 | Yu et al. |
| 5,893,796 | A | 4/1999 | Birang et al. |
| 6,153,116 | A | 11/2000 | Yang et al. |
| 6,172,756 | B1 | 1/2001 | Chalmers et al. |
| 6,184,985 | B1 | 2/2001 | Chalmers et al. |

(Continued)

FOREIGN PATENT DOCUMENTS

EP    1 176 631 A1    1/2002

(Continued)

OTHER PUBLICATIONS

Annex to Form PCT/ISA/206, Communication Relating to the Results of the Partial International Search, International Application No. PCT/US2006/032659, Feb. 6, 2007, 3 pp.

(Continued)

*Primary Examiner*—Sean P Shechtman
(74) *Attorney, Agent, or Firm*—Fish & Richardson

(57) ABSTRACT

A method for determining a polishing endpoint includes obtaining spectra from different zones on a substrate during different times in a polishing sequence, matching the spectra with indexes in a library and using the indexes to determining a polishing rate for each of the different zones from the indexes. An adjusted polishing rate can be determined for one of the zones, which causes the substrate to have a desired profile when the polishing end time is reached.

19 Claims, 22 Drawing Sheets

U.S. PATENT DOCUMENTS

| | | | |
|---|---|---|---|
| 6,190,234 B1 | 2/2001 | Swedek et al. | |
| 6,204,922 B1 | 3/2001 | Chalmers | |
| 6,271,047 B1 | 8/2001 | Ushio et al. | |
| 6,296,548 B1 | 10/2001 | Wiswesser et al. | |
| 6,358,327 B1 | 3/2002 | Pokharna et al. | |
| 6,361,646 B1 | 3/2002 | Bibby, Jr. et al. | |
| 6,489,624 B1 * | 12/2002 | Ushio et al. | 250/559.27 |
| 6,623,991 B2 | 9/2003 | Johnson et al. | |
| 6,676,482 B2 | 1/2004 | Bibby, Jr. et al. | |
| 6,678,046 B2 | 1/2004 | Opsal | |
| 6,678,055 B2 | 1/2004 | Du-Nour et al. | |
| 6,762,838 B2 | 7/2004 | Du-Nour | |
| 6,768,967 B2 | 7/2004 | Johnson et al. | |
| 6,801,321 B1 | 10/2004 | Du-Nour | |
| 6,806,105 B2 | 10/2004 | Johnson et al. | |
| 6,806,948 B2 | 10/2004 | Katz et al. | |
| 6,813,034 B2 | 11/2004 | Rosencwaig et al. | |
| 6,819,426 B2 | 11/2004 | Sezginer et al. | |
| 6,842,259 B2 | 1/2005 | Rosencwaig et al. | |
| 6,885,467 B2 | 4/2005 | DuNour et al. | |
| 6,898,596 B2 | 5/2005 | Aikens et al. | |
| 6,947,135 B2 | 9/2005 | Johnson | |
| 7,018,271 B2 | 3/2006 | Wiswesser et al. | |
| 7,097,537 B1 | 8/2006 | David et al. | |
| 7,255,771 B2 | 8/2007 | Chen et al. | |
| 2001/0039064 A1 | 11/2001 | Ushio et al. | |
| 2002/0127951 A1 | 9/2002 | Ishikawa et al. | |
| 2002/0173225 A1 | 11/2002 | Wang et al. | |
| 2003/0022400 A1 | 1/2003 | Nomoto et al. | |
| 2003/0053042 A1 | 3/2003 | Chen | |
| 2003/0153246 A1 | 8/2003 | Desai et al. | |
| 2003/0184732 A1 | 10/2003 | Katz et al. | |
| 2003/0205664 A1 | 11/2003 | Abe et al. | |
| 2005/0117164 A1 | 6/2005 | Nomoto et al. | |
| 2006/0020419 A1 | 1/2006 | Benvegnu | |
| 2006/0274326 A1 | 12/2006 | Kobayashi et al. | |
| 2007/0039925 A1 | 2/2007 | Swedek et al. | |
| 2007/0042675 A1 | 2/2007 | Benvegnu et al. | |

FOREIGN PATENT DOCUMENTS

| | | |
|---|---|---|
| JP | 2000-183001 | 6/2000 |
| JP | 2000-310512 | 11/2000 |
| JP | 2001-287159 | 10/2001 |
| JP | 2002-359217 | 12/2002 |
| JP | 2005-159203 | 6/2005 |
| WO | WO 00/54935 A1 | 9/2000 |
| WO | WO 01/72470 A1 | 10/2001 |
| WO | WO 2004/035265 A1 | 4/2004 |

OTHER PUBLICATIONS

International Search Report and Written Opinion of the International Searching Authority, International Application Serial No. PCT/US2006/032659, May 16, 2007, 17 pp.

* cited by examiner

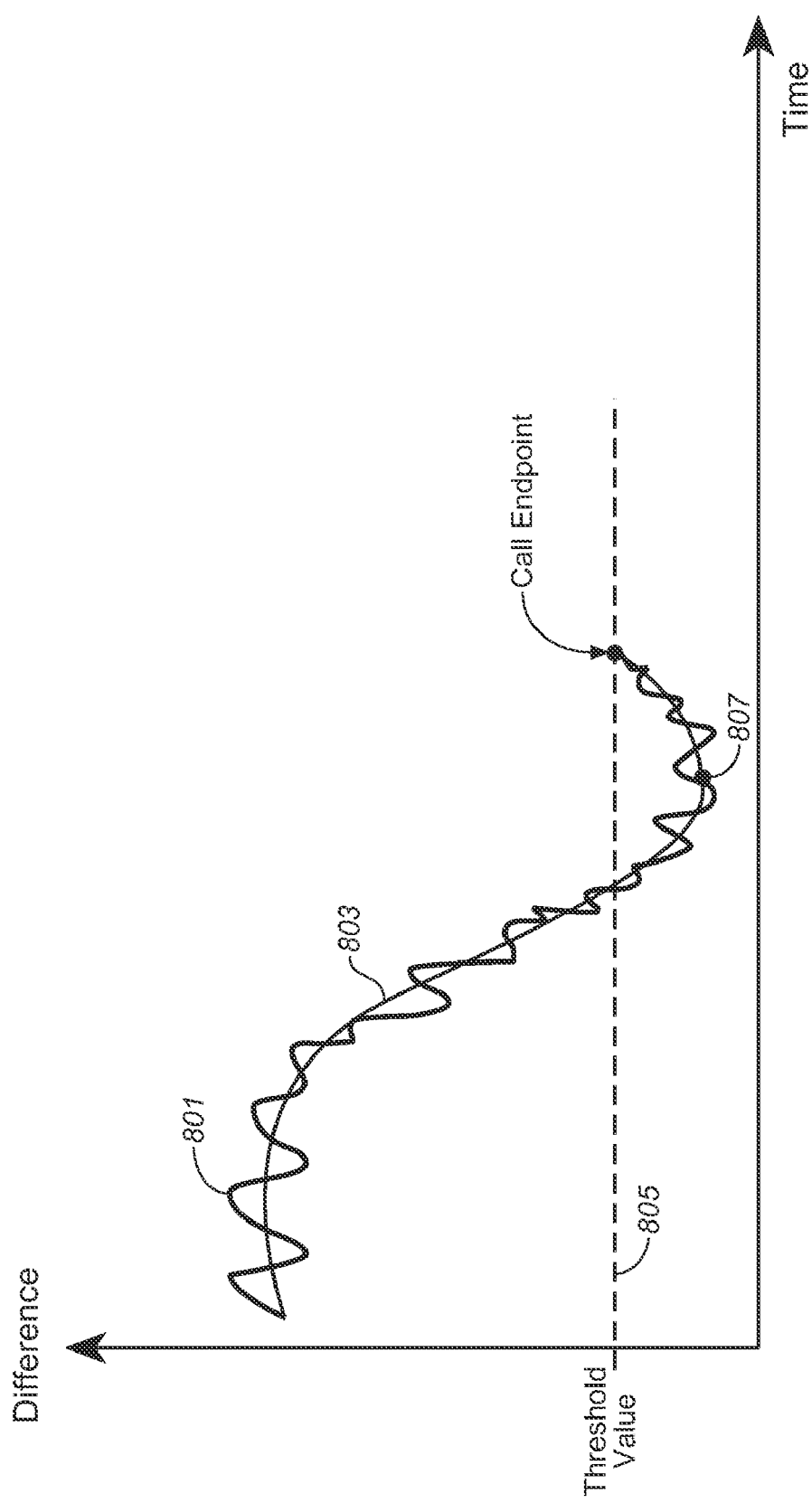

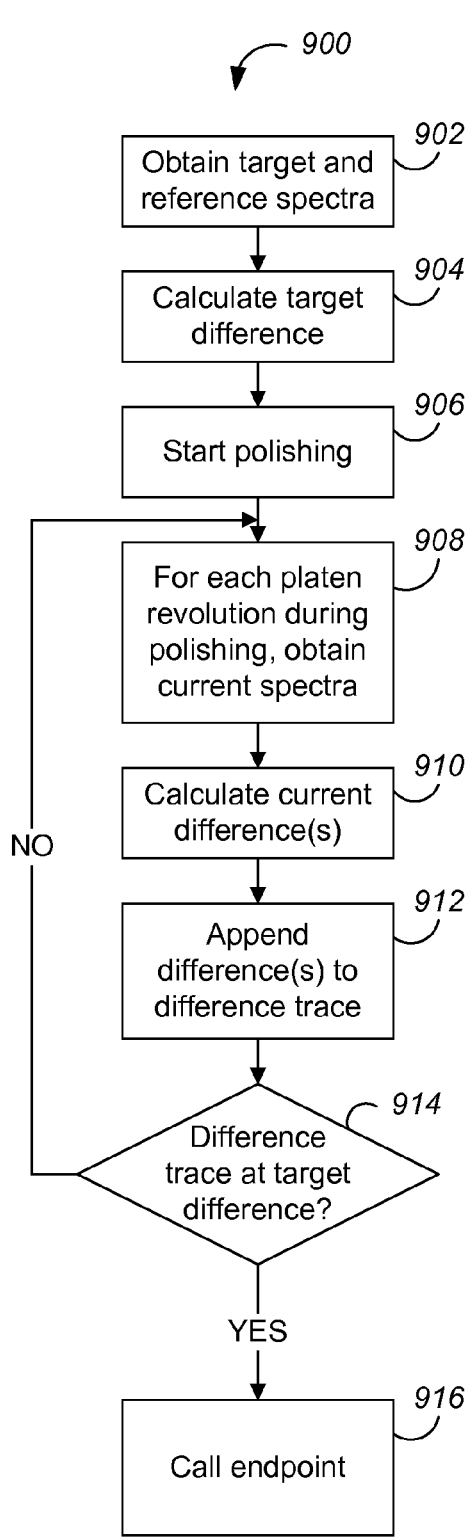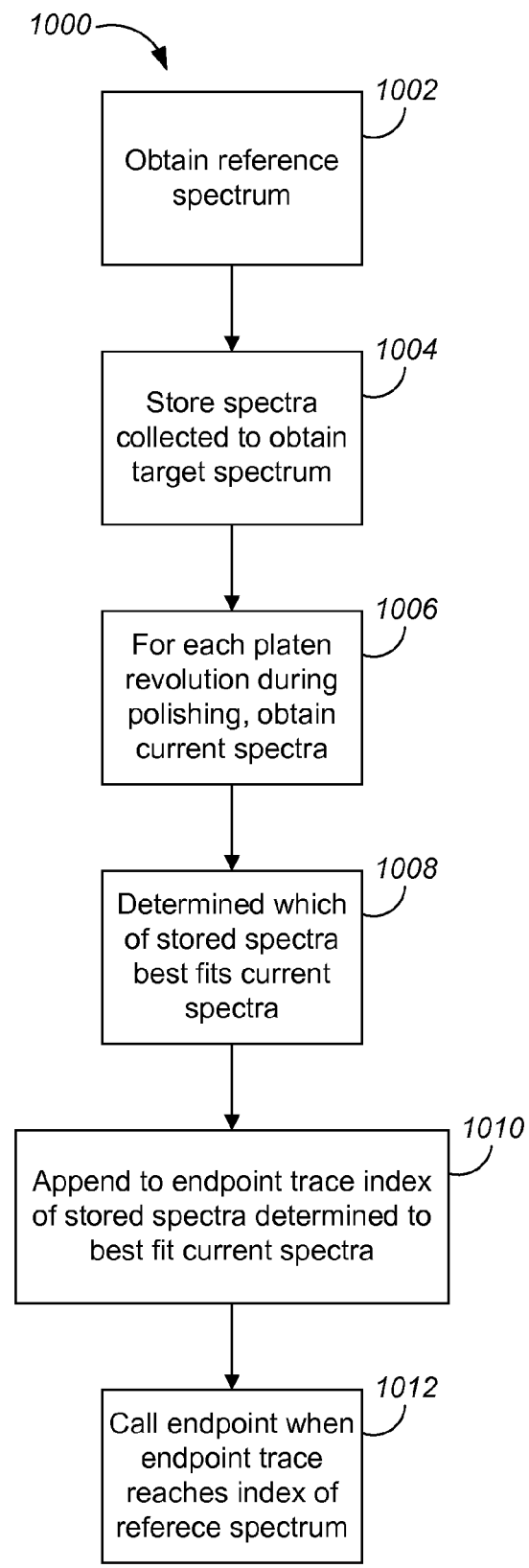
FIG. 9A
FIG. 10A

SUBSTRATE THICKNESS MEASURING DURING POLISHING

CROSS-REFERENCE TO RELATED APPLICATIONS

This application claims the benefit of priority of U.S. Provisional Application Ser. No. 60/747,768, filed May 19, 2006, and is a continuation-in-part of U.S. application Ser. No. 11/213,344, which is now U.S. Publication No. 2007/0042675, filed Aug. 26, 2005, which claims priority to U.S. Provisional Application Ser. No. 60/710,682, filed Aug. 22, 2005. The disclosure of each prior application is considered part of and is incorporated by reference in the disclosure of this application.

BACKGROUND

The present invention relates to generally to chemical mechanical polishing of substrates.

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing disk pad or belt pad. The polishing pad can be either a standard pad or a fixed abrasive pad. A standard pad has a durable roughened surface, whereas a fixed-abrasive pad has abrasive particles held in a containment media. The carrier head provides a controllable load on the substrate to push it against the polishing pad. A polishing slurry is typically supplied to the surface of the polishing pad. The polishing slurry includes at least one chemically reactive agent and, if used with a standard polishing pad, abrasive particles.

One problem in CMP is determining whether the polishing process is complete, i.e., whether a substrate layer has been planarized to a desired flatness or thickness, or when a desired amount of material has been removed. Overpolishing (removing too much) of a conductive layer or film leads to increased circuit resistance. On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

SUMMARY

In one general aspect, a computer-implemented method is described. The method includes obtaining a first spectrum of reflected light from a first zone on a substrate and a second spectrum from a second zone on the substrate during a polishing sequence and comparing the first spectrum and the second spectrum to a spectra library to determine a first index for the first spectrum and a second index for the second spectrum. Then, a third spectrum of reflected light from the first zone and a fourth spectrum from the second zone are obtained at a different time during the polishing sequence and are compared to the library to determine a third index for the first zone and a fourth index for the second zone. A polishing rate at the first zone is determined from the first index and the third index and a polishing rate at the second zone is determined from the second index and the fourth index. Based on the first polishing rate, the second polishing rate, a first target relative thickness for the first zone and a second target relative thickness for the second zone, an adjusted polishing rate for the second zone is determined, which would cause the second zone to be polished to the second target relative thickness at substantially the same time as the first zone is polished to the first target relative thickness.

In another embodiment, a method of monitoring a chemical mechanical polishing process is described. A multi-wavelength light beam is directed onto a substrate undergoing polishing and measuring a spectrum of light reflected from the substrate. The light beam is caused to move in a path across the substrate surface. A sequence of spectral measurements are extracted from the signal and determining a radial position on the substrate for each of the spectral measurements. The spectral measurements are sorted into a plurality of radial ranges according to the radial positions. A polishing endpoint is determined for the substrate from the spectral measurements in at least one of the plurality of radial ranges.

Systems for performing the method steps described herein, including a light source, a detector and a controller are described. Computer program products are configured to perform at least some of the method steps.

Embodiments of the above mentioned methods and systems for performing the above mentioned methods may include one or more of the following features. The first zone can be an inner zone and the second zone can be an outer annular zone. Determining an adjusted polishing rate for the second zone can include determining when the first target relative thickness will be within a predetermined threshold from the second target relative thickness or determining an estimated endpoint time for the polishing sequence. Obtaining the first spectrum and a second spectrum can include obtaining white light spectra. A parameter of the polishing system can be adjusted to cause the second zone to be polished at the adjusted polishing rate. Determining the adjusted polishing rate can be performed on a set-up substrate and the step of adjusting a parameter of the polishing system is performed on a product substrate or performed on product substrate and the step of adjusting a parameter of the polishing system performed on the product substrate. Adjusting a parameter of the polishing system can include adjusting pressure. Determining an adjusted polishing rate can include determining a rate of polishing which causes a cross section along a diameter of the substrate to have a flat profile when the polishing sequence is completed.

Determining an adjusted polishing rate can include determining a rate of polishing which causes a cross section along a diameter of the substrate to have a bowl-like shape when the polishing sequence is completed. Obtaining the first spectrum and the second spectrum can include sampling the substrate at different rotational locations or measuring spectra reflected from an oxide layer. The method can include polishing a set up substrate until the set up substrate is overpolished, obtaining a plurality of spectra from a single zone of the test substrate during the polishing and storing the plurality of spectra in combination with a time at which each spectrum was obtained to create the spectra library. The method can include creating indexes for the spectra library, wherein an index represents a spectrum obtained from the set up substrate at a specified time. The method can include determining an adjusted polishing rate for one of the radial ranges and applying the adjusted polishing rate to the one of the radial ranges.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 8A and 8B show a method for endpoint determination.

FIGS. 9A and 9B show an alternative method for endpoint determination.

FIGS. 10A and 10B show another alternative method for endpoint determination.

Like reference symbols in the various drawings indicate like elements.

DETAILED DESCRIPTION

Figure 1:
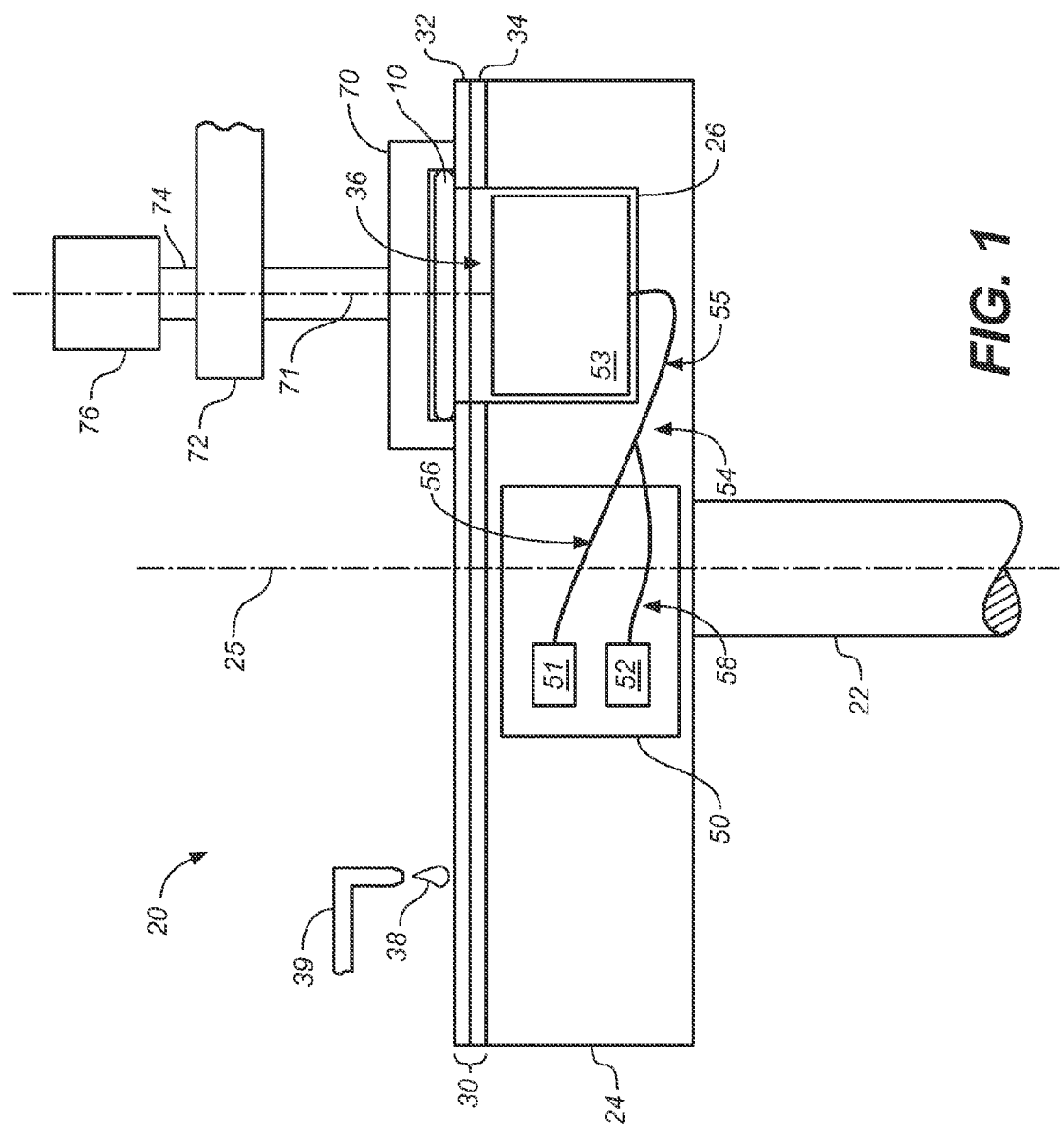
FIG. 1 shows a chemical mechanical polishing apparatus.

FIG. 1 shows a polishing apparatus 20 operable to polish a substrate 10. The polishing apparatus 20 includes a rotatable disk-shaped platen 24, on which a polishing pad 30 is situated. The platen is operable to rotate about axis 25. For example, a motor can turn a drive shaft 22 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

Optical access 36 through the polishing pad is provided by including an aperture (i.e., a hole that runs through the pad) or a solid window. The solid window can be secured to the polishing pad, although in some implementations the solid window can be supported on the platen 24 and project into an aperture in the polishing pad. The polishing pad 30 is usually placed on the platen 24 so that the aperture or window overlies an optical head 53 situated in a recess 26 of the platen 24. The optical head 53 consequently has optical access through the aperture or window to a substrate being polished. The optical head is further described below.

The window can be, for example, a rigid crystalline or glassy material, e.g., quartz or glass, or a softer plastic material, e.g., silicone, polyurethane or a halogenated polymer (e.g., a fluoropolymer), or a combination of the materials mentioned. The window can be transparent to white light. If a top surface of the solid window is a rigid crystalline or glassy material, then the top surface should be sufficiently recessed from the polishing surface to prevent scratching. If the top surface is near and may come into contact with the polishing surface, then the top surface of the window should be a softer plastic material. In some implementations the solid window is secured in the polishing pad and is a polyurethane window, or a window having a combination of quartz and polyurethane. The window can have high transmittance, for example, approximately 80% transmittance, for monochromatic light of a particular color, for example, blue light or red light. The window can be sealed to the polishing pad 30 so that liquid does not leak through an interface of the window and the polishing pad 30.

In one implementation, the window includes a rigid crystalline or glassy material covered with an outer layer of a softer plastic material. The top surface of the softer material can be coplanar with the polishing surface. The bottom surface of the rigid material can be coplanar with or recessed relative to the bottom surface of the polishing pad. In particular, if the polishing pad includes two layers, the solid window can be integrated into the polishing layer, and the bottom layer can have an aperture aligned with the solid window.

Assuming that the window includes a combination of a rigid crystalline or glassy material and a softer plastic material, no adhesive need be used to secure the two portions. For example, in one implementation, no adhesive is used to couple the polyurethane portion to the quartz portion of the window. Alternatively, an adhesive that is transparent to white light can be used or an adhesive can be applied so that light passing through the window does not pass through the adhesive. By way of example, the adhesive can be applied only to the perimeter of the interface between the polyurethane and quartz portion. A refractive index gel can be applied to a bottom surface of the window.

A bottom surface of the window can optionally include one or more recesses. A recess can be shaped to accommodate, for example, an end of an optical fiber cable or an end of an eddy current sensor. The recess allows the end of the optical fiber cable or the end of the eddy current sensor to be situated at a distance, from a substrate surface being polished, that is less than a thickness of the window. With an implementation in which the window includes a rigid crystalline portion or glass like portion and the recess is formed in such a portion by machining, the recess is polished so as to remove scratches caused by the machining. Alternatively, a solvent and/or a liquid polymer can be applied to the surfaces of the recess to remove scratches caused by machining. The removal of scratches usually caused by machining reduces scattering and can improve the transmittance of light through the window.

Figure 2A:
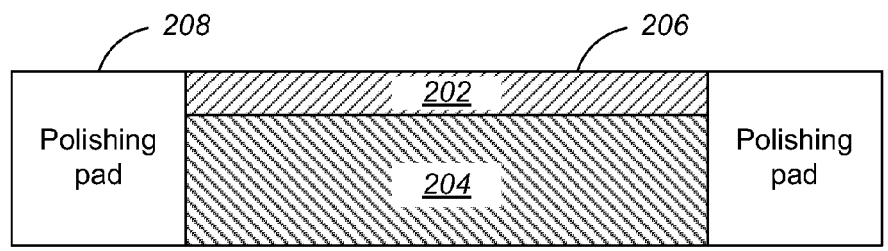
FIGS. 2A-2H show implementations of a polishing pad window.

FIG. 2A-2H show various implementations of the window. As shown in FIG. 2A, the window can have two portions, a polyurethane portion 202 and a quartz portion 204. The portions are layers, with the polyurethane portion 202 situated on top of the quartz portion 204. The window can be situated in the polishing pad so that the top surface 206 of the polyurethane layer is coplanar with a polishing surface 208 of the polishing pad.

Figure 2B:
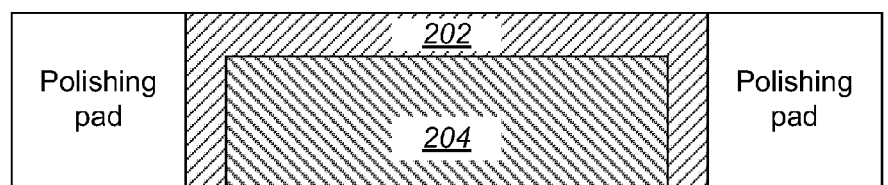

As shown in FIG. 2B, the polyurethane portion 202 can have a recess in which the quartz portion is situated. A bottom surface 210 of the quartz portion is exposed.

Figure 2C:
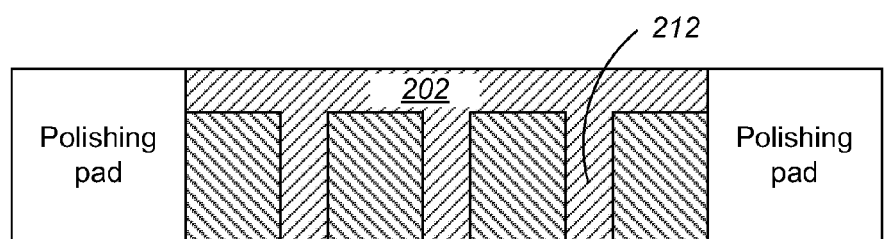

As shown in FIG. 2C, the polyurethane portion 202 can include projections, for example, projection 212, that project into the quartz portion 204. The projections can act to reduce the likelihood that the polyurethane portion 202 will be pulled away from the quartz portion 204 due to friction from the substrate or retaining ring.

Figure 2D:
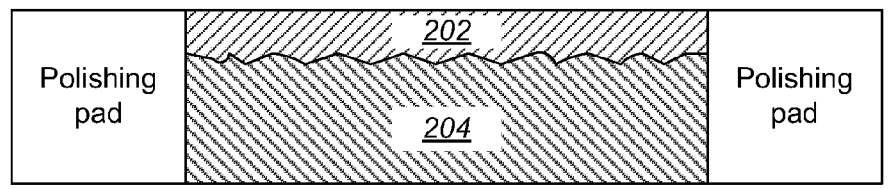

As shown in FIG. 2D, the interface between the polyurethane portion 202 and quartz portion 204 can be a rough surface. Such a surface can improve the strength of the coupling of the two portions of the window, also reducing the likelihood the polyurethane portion 202 will be pulled away from the quartz portion 204 due to friction from the substrate or retaining ring.

Figure 2E:
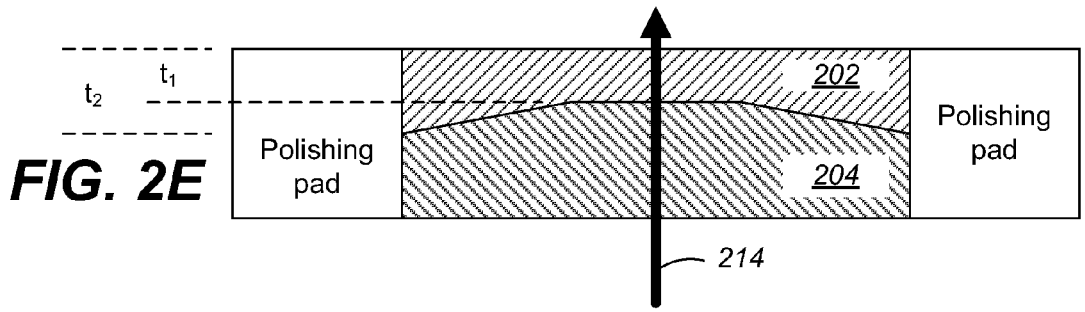

As shown in FIG. 2E, the polyurethane portion 202 can have non uniform thickness. The thickness at a location that would be in the path 214 of a light beam is less than the thickness at a location that would not be in the path 214 of the light beam. By way of example, thickness $t_1$ is less than thickness $t_2$. Alternatively, the thickness can be less at the edges of the window.

Figure 2F:
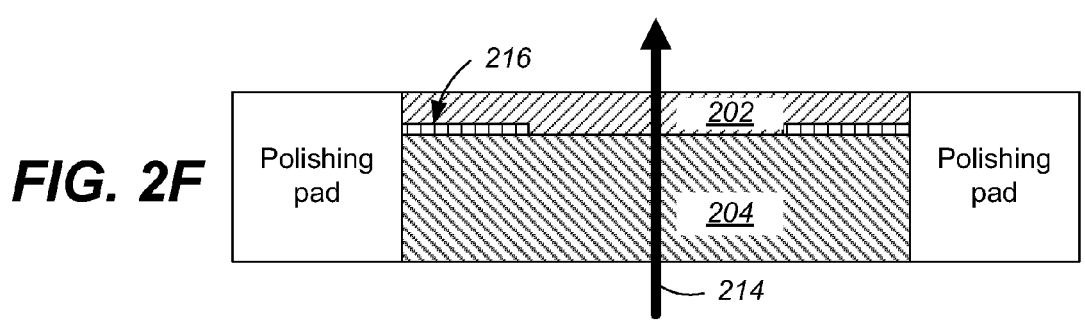

As shown in FIG. 2F, the polyurethane portion 202 can be attached to the quartz portion 204 by use of an adhesive 216. The adhesive can be applied so that it would not be in the path 214 of the light beam.

Figure 2G:
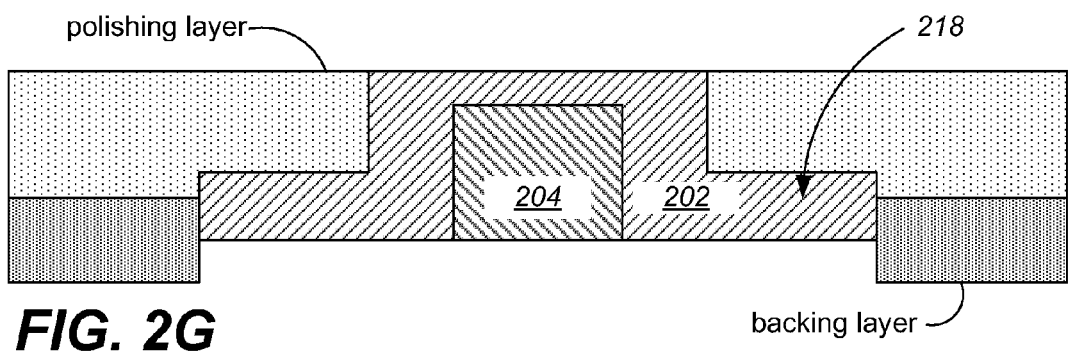

As shown in FIG. 2G, the polishing pad can include a polishing layer and a backing layer. The polyurethane portion 202 extends through the polishing layer and at least partially into the backing layer. The hole in the backing layer can be larger in size than the hole in the polishing layer, and the section of the polyurethane in the backing layer can be wider than the section of the polyurethane in the polishing layer. The polishing layer thus provides a lip 218 which overhangs the window and which can act to resist a pulling of the polyurethane portion 202 away from the quartz portion 204. The polyurethane portion 202 conforms to the holes of the layers of the polishing pad.

Figure 2H:
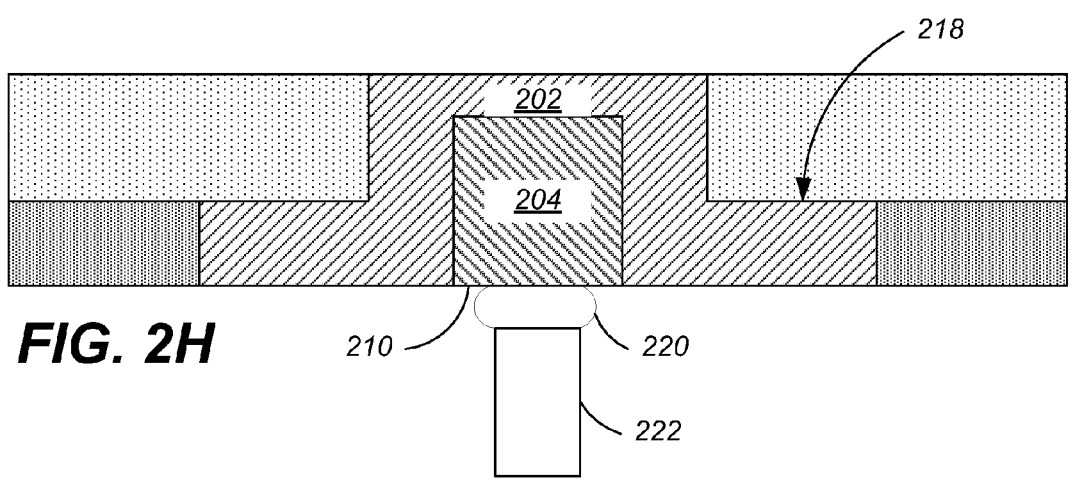

As shown in FIG. 2H, refractive index gel 220 can be applied to the bottom surface 210 of the quartz portion 204 so as to provide a medium for light to travel from a fiber cable 222 to the window. The refractive index gel 220 can fill the volume between the fiber cable 222 and the quartz portion 204 and can have a refractive index that matches or is between the indices of refraction of the fiber cable 222 and the quartz portion 204.

In implementations where the window includes both quartz and polyurethane portions, the polyurethane portion should have a thickness so that, during the life time of the polishing pad, the polyurethane portion will not be worn so as to expose the quartz portion. The quartz can be recessed from the bottom surface of the polishing pad, and the fiber cable 222 can extend partially into the polishing pad.

The above described window and polishing pad can be manufactured using a variety of techniques. The polishing pad's backing layer 34 can be attached to its outer polishing layer 32, for example, by adhesive. The aperture that provides optical access 36 can be formed in the pad 30, e.g., by cutting or by molding the pad 30 to include the aperture, and the window can be inserted into the aperture and secured to the pad 30, e.g., by an adhesive. Alternatively, a liquid precursor of the window can be dispensed into the aperture in the pad 30 and cured to form the window. Alternatively, a solid transparent element, e.g., the above described crystalline or glass like portion, can be positioned in liquid pad material, and the liquid pad material can be cured to form the pad 30 around the transparent element. In either of the later two cases, a block of pad material can be formed, and a layer of polishing pad with the molded window can be scythed from the block.

With an implementation in which the window includes a crystalline or glass like first portion and a second portion made of soft plastic material, the second portion can be formed in the aperture of the pad 30 by applying the described liquid precursor technique. The first portion can then be inserted. If the first portion is inserted before the liquid precursor of the second portion is cured, then curing can bond the first and second portions. If the first portion is inserted after the liquid precursor is cured, then the first and second potions can be secured by using an adhesive.

The polishing apparatus 20 can include a flushing system to improve light transmission through the optical access 36. There are different implementations of the flushing system. With implementations of the polishing apparatus 20 in which the polishing pad 30 includes an aperture instead of a solid window, the flushing system is implemented to provide a laminar flow of a fluid, e.g., a gas or liquid, across a top surface of the optical head 53. (The top surface can be a top surface of a lens included in the optical head 53.) The laminar flow of fluid across the top surface of the optical head 53 can sweep opaque slurry out of the optical access and/or prevent slurry from drying on the top surface and, consequently, improves transmission through the optical access. With implementations in which the polishing pad 30 includes a solid window instead of an aperture, the flushing system is implemented to direct a flow of gas at a bottom surface of the window. The flow of gas can prevent condensation from forming at the solid window's bottom surface which would otherwise impede optical access.

Figure 3:
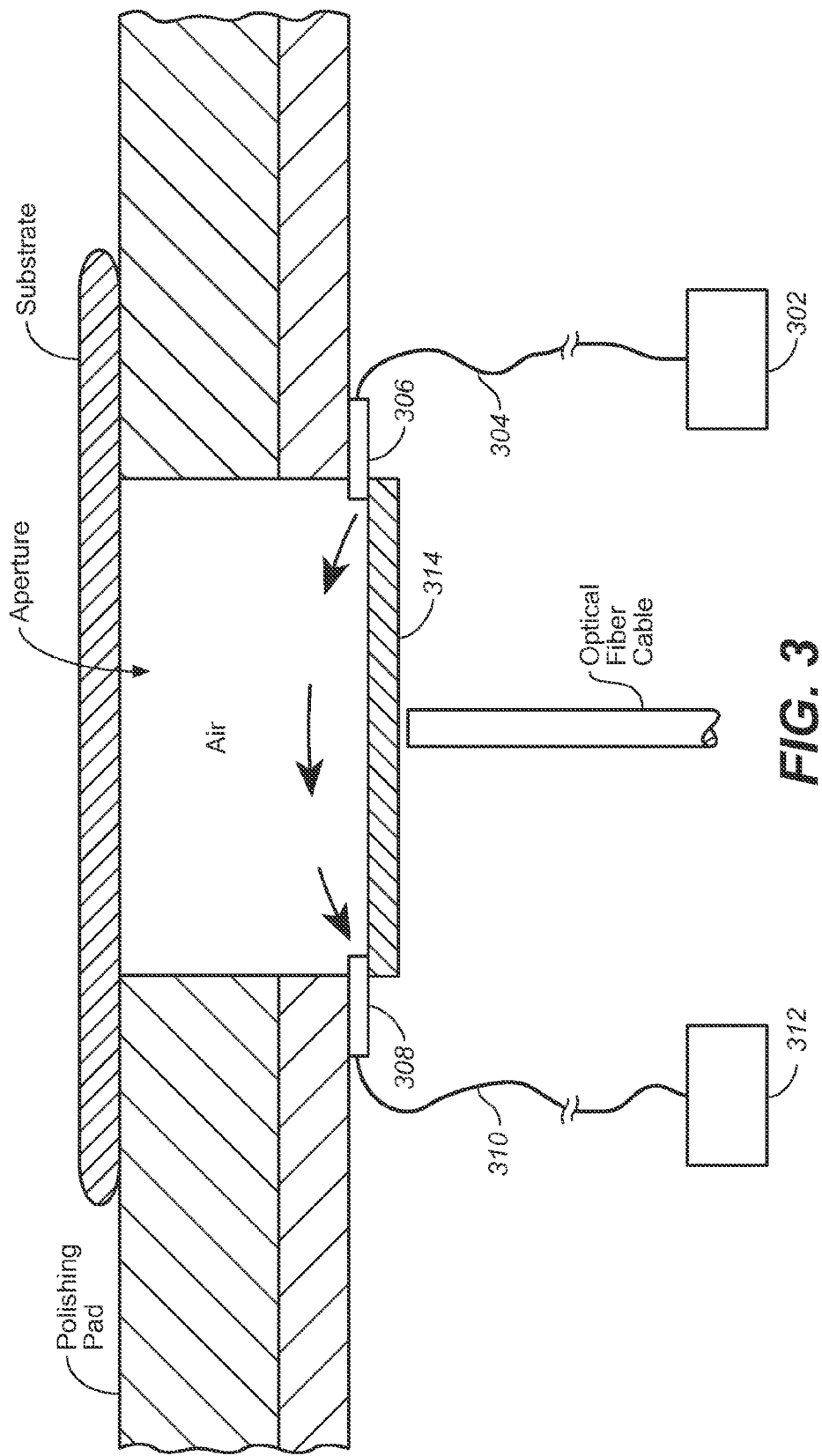
FIG. 3 shows an implementation of a flushing system.

FIG. 3 shows an implementation of the laminar flow flushing system. The flushing system includes a gas source 302, a delivery line 304, a delivery nozzle 306, a suction nozzle 308, a vacuum line 310, and a vacuum source 312. The gas source 302 and vacuum source can be configured so that they can introduce and suction a same or a similar volume of gas. The delivery nozzle 306 is situated so that the laminar flow of gas is directed across the transparent top surface 314 of the in situ monitoring module and not directed at the substrate surface being polished. Consequently, the laminar flow of gas does not dry out slurry on a substrate surface being polished, which can undesirably affect polishing.

Figure 4:
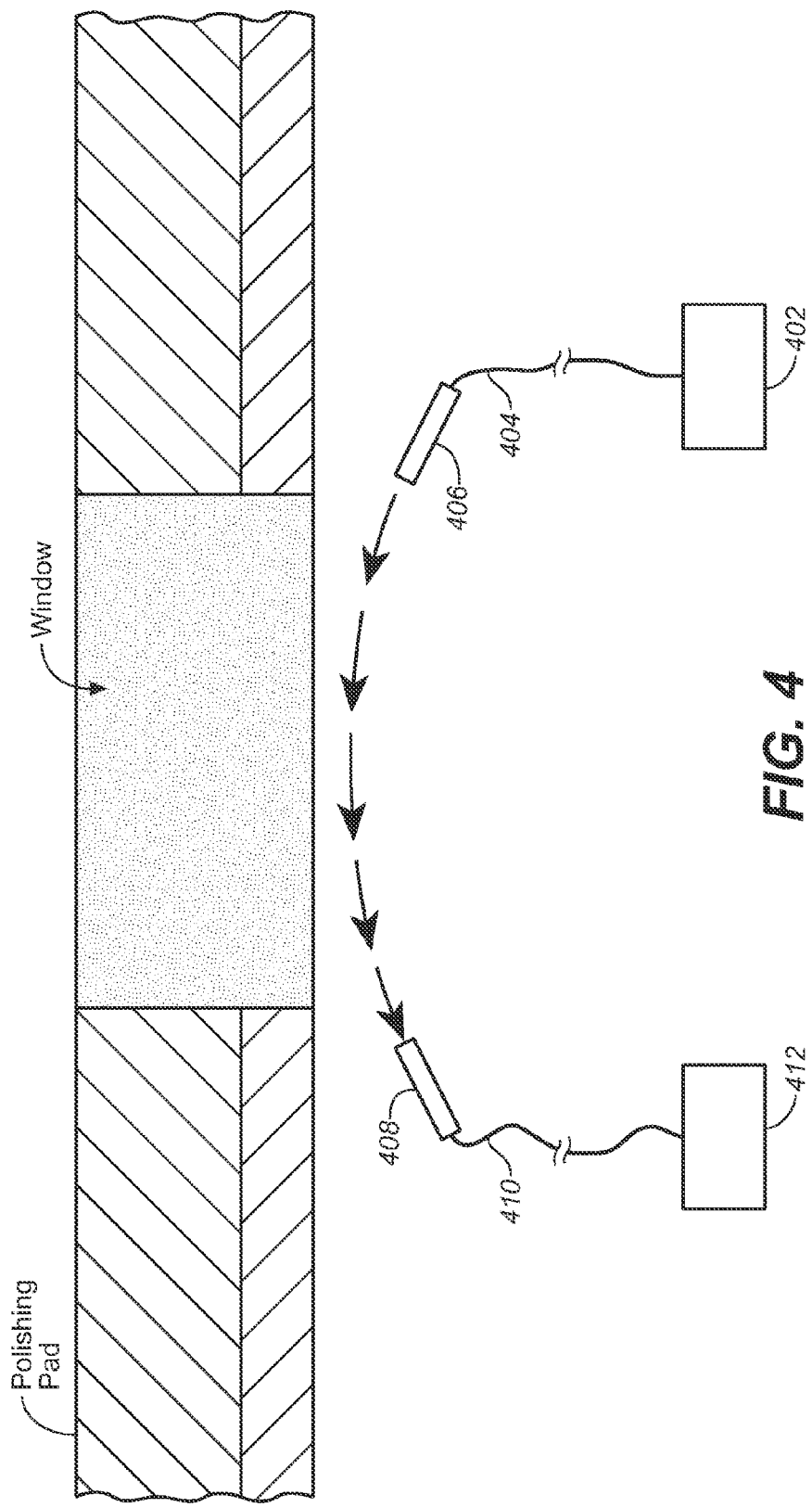
FIG. 4 shows an alternative implementation of the flushing system.

FIG. 4 shows an implementation of the flushing system for preventing the formation of condensation on a bottom surface of the solid window. The system reduces or prevents the formation of condensation at the bottom surface of the polishing pad window. The system includes a gas source 402, a delivery line 404, a delivery nozzle 406, a suction nozzle 408, a vacuum line 410, and a vacuum source 412. The gas source 402 and vacuum source can be configured so that they can introduce and suction a same or a similar volume of gas. The delivery nozzle 406 is situated so that the flow of gas is directed at the bottom surface window in the polishing pad 30.

In one implementation that is an alternative to the implementation of FIG. 4, the flushing system does not include a vacuum source or line. In lieu of these components, the flushing system includes a vent formed in the platen so that the gas introduced into the space underneath the solid window can be exhausted to a side of the platen or, alternatively, to any other location in the polishing apparatus that can tolerate moisture.

The above described gas source and vacuum source can be located away from the platen so that they do not rotate with the platen. In this case, a rotational coupler for convey gas is included each of the supply line and the vacuum line.

Returning to FIG. 1, the polishing apparatus 20 includes a combined slurry/rinse arm 39. During polishing, the arm 39 is operable to dispense slurry 38 containing a liquid and a pH adjuster. Alternative, the polishing apparatus includes a slurry port operable to dispense slurry onto polishing pad 30.

The polishing apparatus 20 includes a carrier head 70 operable to hold the substrate 10 against the polishing pad 30. The carrier head 70 is suspended from a support structure 72, for example, a carousel, and is connected by a carrier drive shaft 74 to a carrier head rotation motor 76 so that the carrier head can rotate about an axis 71. In addition, the carrier head 70 can oscillate laterally in a radial slot formed in the support structure 72. In operation, the platen is rotated about its central axis 25, and the carrier head is rotated about its central axis 71 and translated laterally across the top surface of the polishing pad.

The polishing apparatus also includes an optical monitoring system, which can be used to determine a polishing endpoint as discussed below. The optical monitoring system includes a light source 51 and a light detector 52. Light passes from the light source 51, through the optical access 36 in the polishing pad 30, impinges and is reflected from the substrate 10 back through the optical access 36, and travels to the light detector 52.

A bifurcated optical cable 54 can be used to transmit the light from the light source 51 to the optical access 36 and back from the optical access 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54 (e.g., as shown in FIG. 3). Alternatively, the optical head 53 can merely hold the end of the trunk 55 adjacent the solid window in the polishing pad. The optical head 53 can hold the above described nozzles of the flushing system. The optical head 53 can be removed from the recess 26 as required, for example, to effect preventive or corrective maintenance.

The platen includes a removable in-situ monitoring module 50. The in situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 22 to the controller for the optical monitoring system. Similarly, the light source can be turned on or off in response to control commands in digital electronic signals that pass from the controller through the rotary coupler to the module 50.

The in-situ monitoring module can also hold the respective ends of the branch portions 56 and 58 of the bifurcated optical fiber 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

In one implementation, the bifurcated fiber cable 54 is a bundle of optical fibers. The bundle includes a first group of optical fibers and a second group of optical fibers. An optical fiber in the first group is connected to convey light from the light source 51 to a substrate surface being polished. An optical fiber in the second group is connected to received light reflecting from the substrate surface being polished and convey the received light to a light detector. The optical fibers can be arranged so that the optical fibers in the second group form an X like shape that is centered on the longitudinal axis of the bifurcated optical fiber 54 (as viewed in a cross section of the bifurcated fiber cable 54). Alternatively, other arrangements can be implemented. For example, the optical fibers in the second group can form V like shapes that are mirror images of each other. A suitable bifurcated optical fiber is available from Verity Instruments, Inc. of Carrollton, Tex.

There is usually an optimal distance between the polishing pad window and the end of the trunk 55 of bifurcated fiber cable 54 proximate to the polishing pad window. The distance can be empirically determined and is affected by, for example, the reflectivity of the window, the shape of the light beam emitted from the bifurcated fiber cable, and the distance to the substrate being monitored. In one implementation, the bifurcated fiber cable is situated so that the end proximate to the window is as close as possible to the bottom of the window without actually touching the window. With this implementation, the polishing apparatus 20 can include a mechanism, e.g., as part of the optical head 53, that is operable to adjust the distance between the end of the bifurcated fiber cable 54 and the bottom surface of the polishing pad window. Alternatively, the proximate end of the bifurcated fiber cable is embedded in the window.

The light source 51 is operable to emit white light. In one implementation, the white light emitted includes light having wavelengths of 200-800 nanometers. A suitable light source is a xenon lamp or a xenon mercury lamp.

The light detector 52 can be a spectrometer. A spectrometer is basically an optical instrument for measuring properties of light, for example, intensity, over a portion of the electromagnetic spectrum. A suitable spectrometer is a grating spectrometer. Typical output for a spectrometer is the intensity of the light as a function of wavelength.

Optionally, the in-situ monitoring module 50 can include other sensor elements. The in-situ monitoring module 50 can include, for example, eddy current sensors, lasers, light emitting diodes, and photodetectors. With implementations in which the in situ monitoring module 50 includes eddy current sensors, the module 50 is usually situated so that a substrate being polished is within working range of the eddy current sensors.

Figure 5:
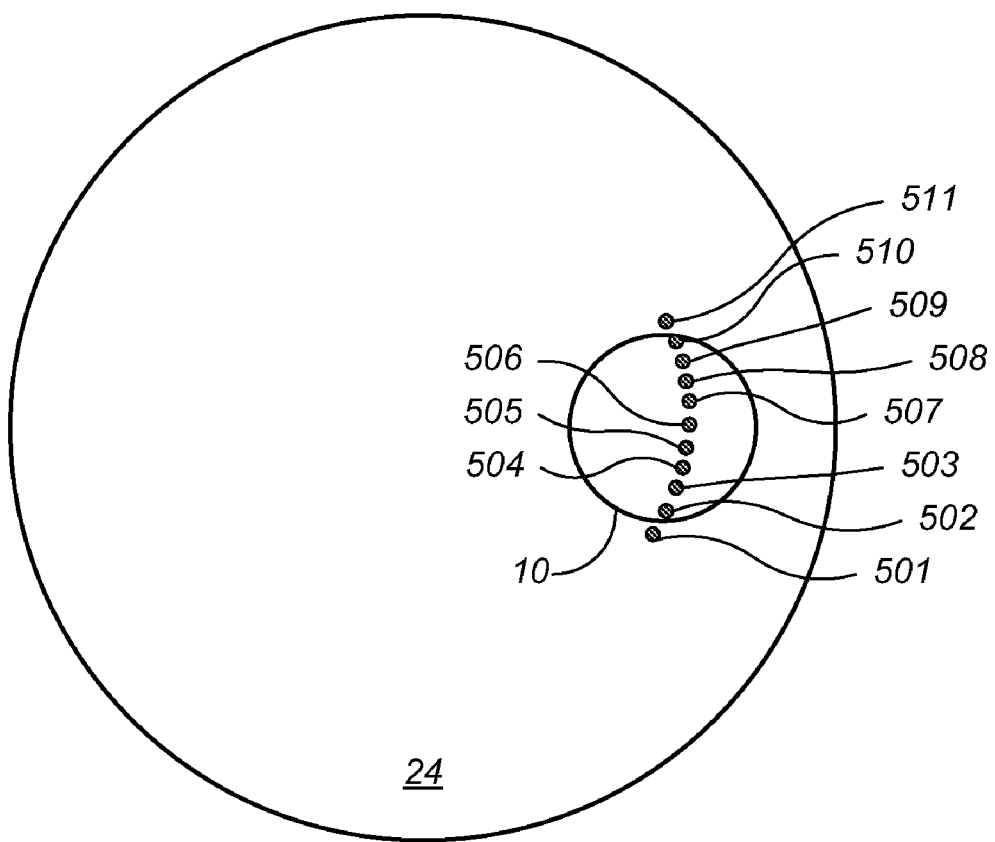
FIG. 5 is an overhead view of a polishing pad and shows locations where in situ measurements are taken.

The light source 51 and light detector 52 are connected to a computing device operable to control their operation and to receive their signals. The computing device can include a microprocessor situated near the polishing apparatus, e.g., a personal computer. With respect to control, the computing device can, for example, synchronize activation of the light source 51 with the rotation of the platen 24. As shown in FIG. 5, the computer can cause the light source 51 to emit a series of flashes starting just before and ending just after the substrate 10 passes over the in situ monitoring module. (Each of points 501-511 depicted represents a location where light from the in situ monitoring module impinged and reflected off.) Alternatively, the computer can cause the light source 51 to emit light continuously starting just before and ending just after the substrate 10 passes over the in situ monitoring module.

Figure 6A:
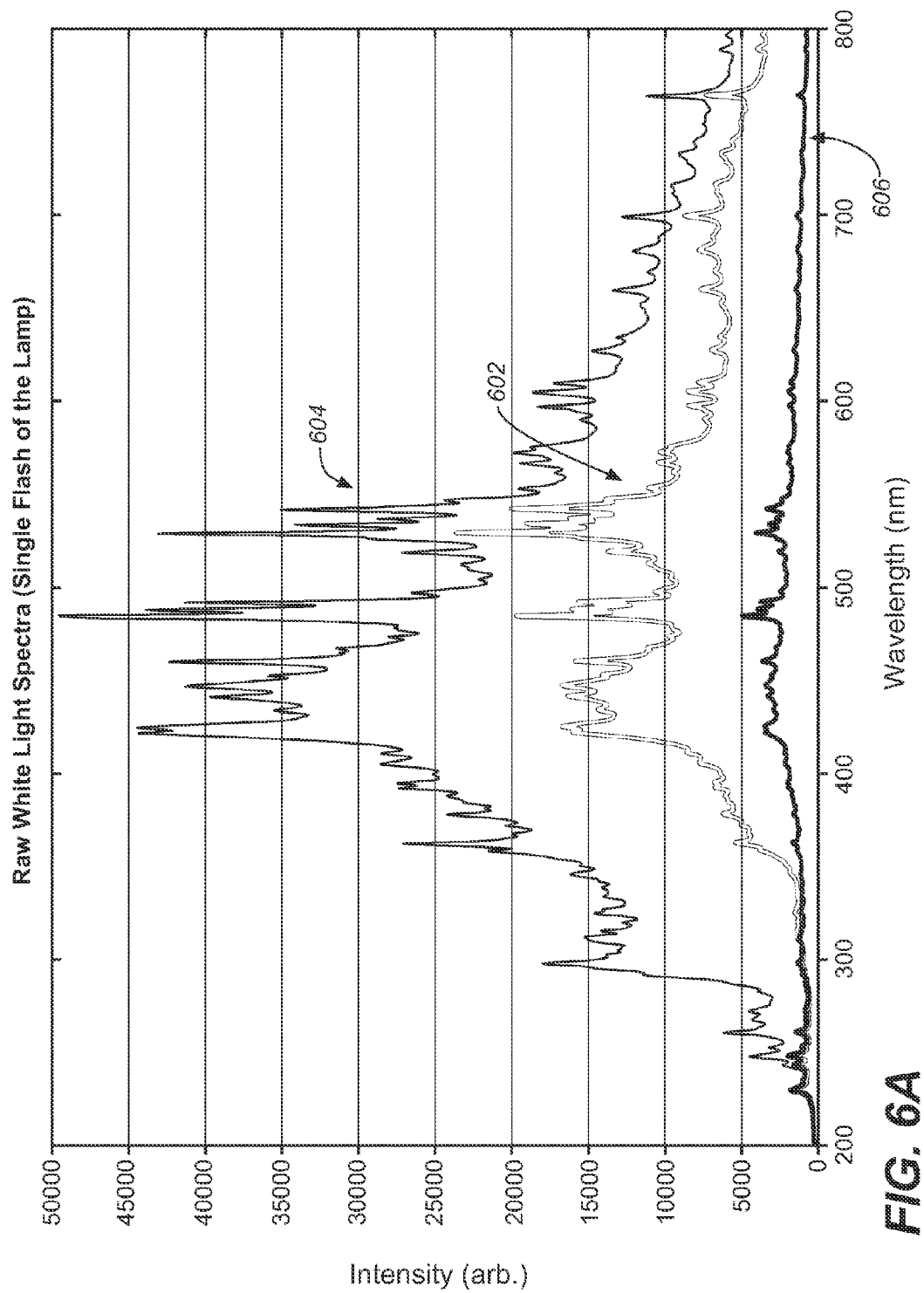
FIG. 6A shows a spectrum obtained from in situ measurements.

With respect to receiving signals, the computing device can receive, for example, a signal that carries information describing a spectrum of the light received by the light detector 52. FIG. 6A shows examples of a spectrum measured from light that is emitted from a single flash of the light source and that is reflected from the substrate. Spectrum 602 is measured from light reflected from a product substrate. Spectrum 604 is measured from light reflected from a base silicon substrate (which is a wafer that has only a silicon layer). Spectrum 606 is from light received by the optical head 53 when there is no substrate situated over the optical head 53. Under this condition, referred to in the present specification as a dark condition, the received light is typically ambient light.

Figure 6B:
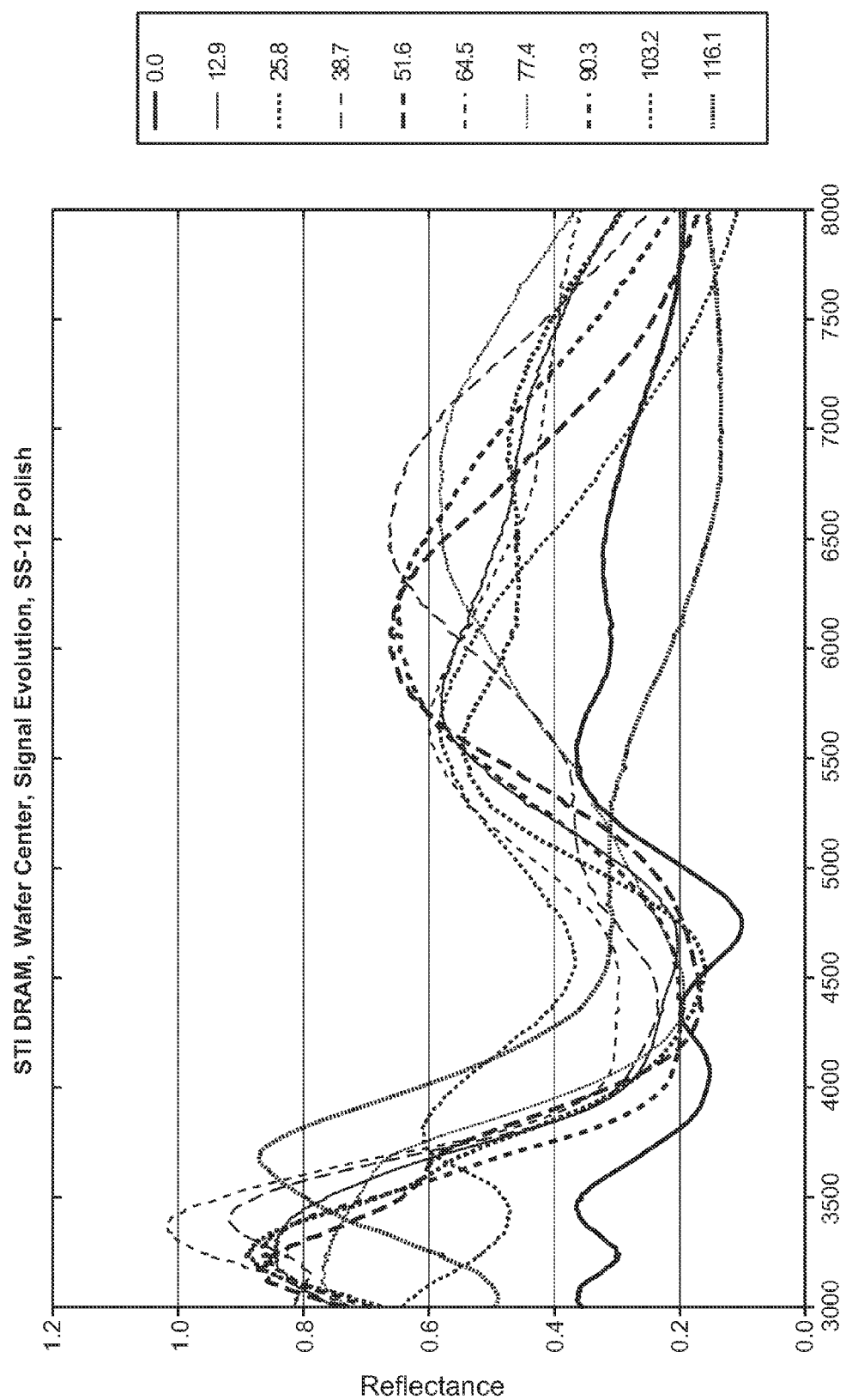
FIG. 6B illustrates the evolution of spectra obtained from in situ measurements as polishing progresses.

The computing device can process the above described signal to determine an endpoint of a polishing step. Without being limited to any particular theory, the spectra of light reflected from the substrate 10 evolve as polishing progresses. FIG. 6B provides an example of the evolution as polishing of a film of interest progresses. The different lines of spectrum represent different times in the polishing. As can be seen, properties of the spectrum of the reflected light changes as a thickness of the film changes, and particular spectrums are exhibited by particular thicknesses of the film. The computing device can execute logic that determines, based on one or more of the spectra, when an endpoint has been reached. The one or more spectra on which an endpoint determination is based can include a target spectrum, a reference spectrum, or both.

As used in the instant specification, a target spectrum refers to a spectrum exhibited by the white light reflecting from a film of interest when the film of interest has a target thickness. By way of example, a target thickness can be 1, 2, or 3 microns. Alternatively, the target thickness can be zero, for example, when the film of interest is cleared so that an underlying film is exposed.

Figure 7A:
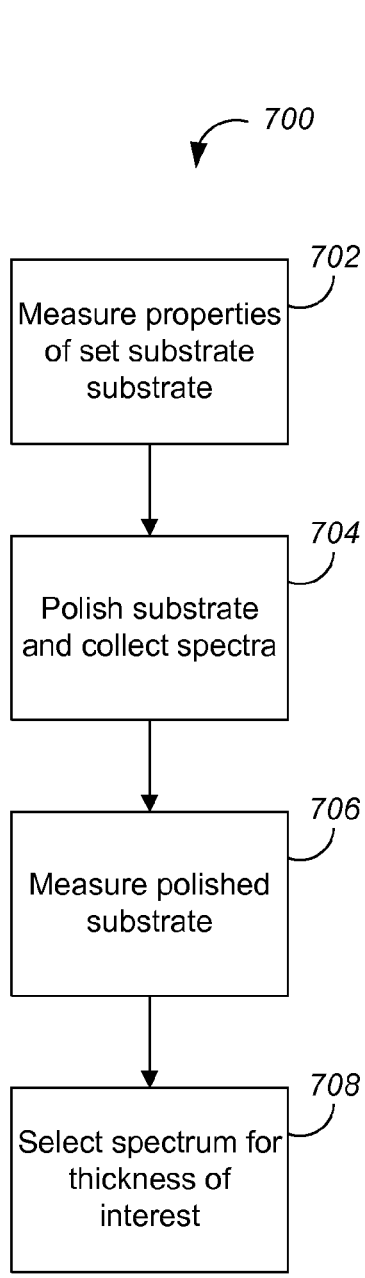
FIG. 7A shows a method for obtaining a target spectrum.

FIG. 7A shows a method 700 for obtaining a target spectrum. Properties of a substrate with the same pattern as the product substrate are measured (step 702). The substrate which is measured is referred to in the instant specification as a "set-up" substrate. The set-up substrate can simply be a substrate which is similar or the same to the product substrate, or the set-up substrate could be one substrate from a batch. The properties can include a pre-polished thickness of a film of interest at a particular location of interest on the substrate. Typically, the thicknesses at multiple locations are measured. The locations are usually selected so that a same type of die feature is measured for each location. Measurement can be performed at a metrology station.

The set-up substrate is polished in accordance with a polishing step of interest and spectra of white light reflecting off a substrate surface being polished are collected during polishing (step 704). Polishing and spectra collection can be performed at the above described polishing apparatus. Spectra are collected by the in situ monitoring system during polishing. The substrate is overpolished, i.e., polished past an estimated endpoint, so that the spectrum of the light that reflected from the substrate when the target thickness is achieved can be obtained.

Properties of the overpolished substrate are measured (step 706). The properties include post polished thicknesses of the film of interest at the particular location or locations used for the pre polish measurement.

The measured thicknesses and the collected spectra are used to select, from among the collected spectra, a spectrum determined to be exhibited by a thickness of interest (step 708). In particular, linear interpolation can be performed using the measured pre polish film thickness and post polish substrate thicknesses to determine which of the spectra was exhibited when the target film thickness was achieved. The spectrum determined to be the one exhibited when the target thickness was achieved is designated to be the target spectrum for the batch of substrates.

Optionally, the spectra collected are processed to enhance accuracy and/or precision. The spectra can be processed, for example: to normalize them to a common reference, to average them, and/or to filter noise from them. Particular implementations of these processing operations are described below.

As used in the instant specification, a reference spectrum refers to a spectrum that is associated with a target film thickness. A reference spectrum is usually empirically selected for particular endpoint determination logic so that the target thickness is achieved when the computer device calls endpoint by applying the particular spectrum based endpoint logic. The reference spectrum can be iteratively selected, as will be described below in reference to FIG. 7B. The reference spectrum is usually not the target spectrum. Rather, the reference spectrum is usually the spectrum of the light reflected from the substrate when the film of interest has a thickness greater than the target thickness.

Figure 7B:
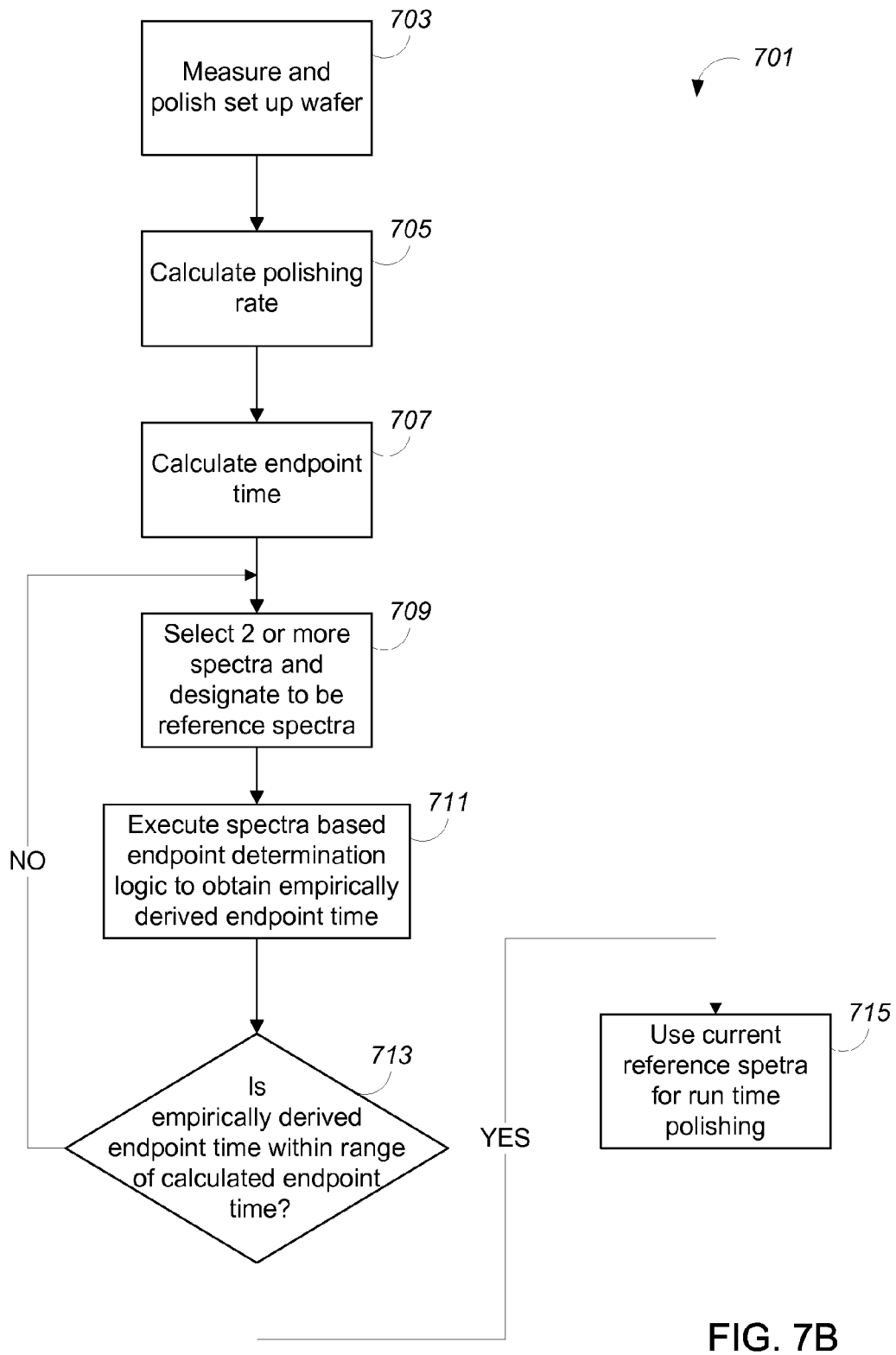
FIG. 7B shows a method for obtaining a reference spectrum.

FIG. 7B shows a method 701 for selecting a reference spectrum for a particular target thickness and particular spectrum based endpoint determination logic. A set up substrate is measured and polished as described above in steps 702 706 (step 703). In particular, spectra collected and the time at which each collected spectrum is measured is stored.

A polishing rate of the polishing apparatus for the particular set-up substrate is calculated (step 705). The average polishing rate PR can be calculated by using the pre and post polished thicknesses $T_1$, $T_2$, and the actual polish time, PT, e.g., $PR=(T_2-T_1)/PT$.

An endpoint time is calculated for the particular set-up substrate to provide a calibration point to test the reference spectrum, as discussed below (step 707). The endpoint time can be calculated based on the calculated polish rate PR, the pre polish starting thickness of the film of interest, ST, and the target thickness of the film of interest, TT. The endpoint time can be calculated as a simple linear interpolation, assuming that the polishing rate is constant through the polishing process, e.g., $ET=(ST-TT)/PR$.

Optionally, the calculated endpoint time can be evaluated by polishing another substrate of the batch of patterned substrates, stopping polishing at the calculated endpoint time, and measuring the thickness of the film of interest. If the thickness is within a satisfactory range of the target thickness, then the calculated endpoint time is satisfactory. Otherwise, the calculated endpoint time can be re-calculated.

One of the collected spectra is selected and designated to be the reference spectrum (step 709). The spectrum selected is a spectrum of light reflected from the substrate when the film of interest has a thickness greater than and is approximately equal to the target thickness.

The particular endpoint determination logic is executed in simulation using the spectra collected for the set-up substrate and with the selected spectrum designated to be the reference spectrum (step 711). Execution of the logic yields an empirically derived but simulated endpoint time that the logic has determined to be the endpoint.

The empirically derived but simulated endpoint time is compared to the calculated endpoint time (step 713). If the empirically derived endpoint time is within a threshold range of the calculated endpoint time, then the currently selected reference spectrum is known to generate a result that matches the calibration point. Thus, when the endpoint logic is executed using the reference spectrum in a run-time environment, the system should reliably detect an endpoint at the target thickness. Therefore, the reference spectrum can be kept as the reference spectrum for run time polishing of the other substrates of the batch (step 715). Otherwise, steps 709 and 711 are repeated as appropriate.

Optionally, variables other than the selected spectrum can be changed for each iteration (i.e., each performance of steps 709 and 711). For example, the above mentioned processing of the spectra (for example, filter parameters) and/or a threshold range from a minimum of a difference trace can be changed. The difference trace and the threshold range of a minimum of the difference trace are described below.

Figure 8A:
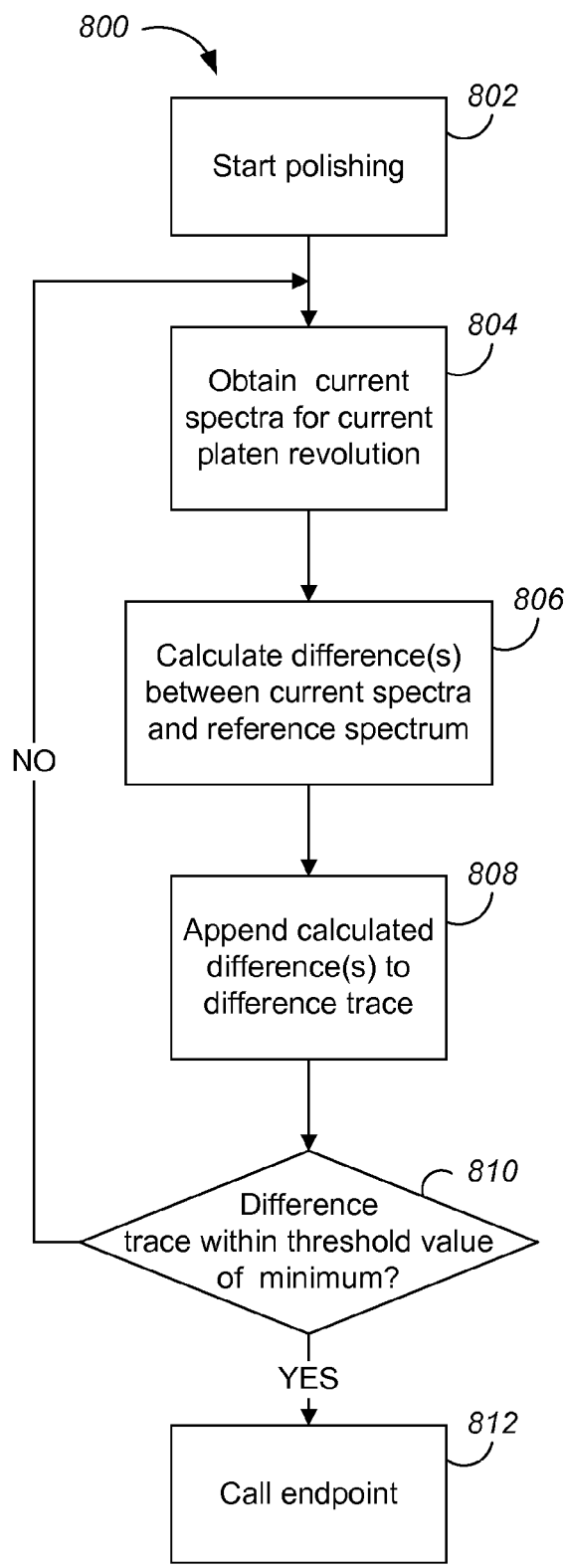

FIG. 8A shows a method 800 for using spectrum based endpoint determination logic to determine an endpoint of a polishing step. Another substrate of the batch of patterned substrates is polished using the above described polishing apparatus (step 802). At each revolution of the platen, the following steps are performed.

One or more spectra of white light reflecting off a substrate surface being polished are measured to obtain one or more current spectra for a current platen revolution (step 804). The one or more spectra measured for the current platen revolution are optionally processed to enhance accuracy and/or precision as described above in reference to FIG. 7A and as described below in reference to FIG. 11. If only one spectrum is measured, then the one spectrum is used as the current spectrum. If more than one current spectra is measured for a platen revolution, then they are grouped, averaged within each group, and the averages are designated to be current spectra. The spectra can be grouped by radial distance from the center of the substrate. By way of example, a first current spectrum can be obtained from spectra measured as points 502 and 510 (FIG. 5), a second current spectrum can be obtained from spectra measured at points 503 and 509, a third current spectra can be obtained from spectra measured at points 504 and 508, and so forth. The spectra measured at points 502 and 510 are averaged to obtain a first current spectrum for the current platen revolution. The spectra measured at points 503 and 509 are averaged to obtain a second current spectrum for the current platen revolution. The spectra measured at points 504 and 508 are averaged to obtain a third current spectrum for the current platen revolution.

A difference between the one or more current spectra and a reference spectrum is calculated (step 806). The reference spectrum can be obtained as described above in reference to FIG. 7B. In one implementation, the difference is a sum of differences in intensities over a range of wavelengths. That is, $$\text{Difference} = \sum_{\lambda=a}^{b} \text{abs}(I_{current}(\lambda) - I_{reference}(\lambda))$$

where a and b are the lower limit and upper limit of the range of wavelengths of a spectrum, respectively, and $I_{current}(\lambda)$ and $I_{reference}(\lambda)$ are the intensity of a current spectra and the intensity of the target spectra for a given wavelength, respectively.

Each calculated difference is appended to a difference trace (step 808). The difference trace is generally a plot of the calculated difference. The difference trace is updated at least once per platen revolution. (When multiple current spectra are obtained for each platen revolution, the difference trace can be updated more than once per platen revolution.)

Optionally, the difference trace can be processed, for example, smoothing the difference trace by filtering out a calculated difference that deviates beyond a threshold from preceding one or more calculated differences.

Whether the difference trace is within a threshold value of a minimum is determined (step 810). After the minimum has been detected, the endpoint is called when the different trace begins to rise past a particular threshold value of the minimum. Alternatively, the endpoint can be called based on the slope of the difference trace. In particular, the slope of the difference trace approaches and becomes zero at the minimum of the difference trace. The endpoint can be called when the slope of the difference trace is within a threshold range of the slope that is near zero.

Optionally, window logic can be applied to facilitate the determination of step 808. Window logic suitable for use is described in commonly assigned U.S. Pat. Nos. 5,893,796 and 6,296,548, which are incorporated by reference.

If the difference trace is NOT determined to have reached a threshold range of a minimum, polishing is allowed to continue and steps 804, 806, 808, and 810 are repeated as appropriate. Otherwise, an endpoint is called and polishing is stopped (step 812).

FIG. 8B illustrates the above described method for determining endpoint. Trace 801 is the raw difference trace. Trace 803 is the smoothed difference trace. Endpoint is called when the smoothed difference trace 803 reaches a threshold value 805 above the minimum 807.

As an alternative to using a reference spectrum, a target spectrum can be used in the method 800. The difference calculation would be between a current spectrum and the target spectrum, and endpoint would be determined when the difference trace reaches a minimum.

FIG. 9A shows an alterative method 900 for using a spectrum based endpoint determination logic to determine an endpoint of a polishing step. A set-up substrate is polished and a target spectrum and reference spectrum are obtained (step 902). These spectra can be obtained as described above in reference to FIGS. 7A and 7B.

A target difference is calculated (step 904). The target difference is the difference between the reference spectrum and the target spectrum and can be calculated using the above described difference equation.

Polishing of another substrate of the batch of substrates is started (step 906). The following steps are performed for each platen revolution during polishing. One or more spectra of white light reflecting off a substrate surface being polished are measured to obtain one or more current spectra for a current platen revolution (step 908). A difference between the current one or more spectra and the reference spectrum is calculated (step 910). The calculated difference or differences (if there are more than one current spectrum) are appended to a difference trace (step 912). Whether the difference trace is within a threshold range of the target difference is determined (step 914). If the difference trace is NOT determined to have reached a threshold range of the target difference, polishing is allowed to continue and steps 908, 910, 912, and 914 are repeated as appropriate. Otherwise, an endpoint is called and polishing is stopped (step 916).

Figure 9B:
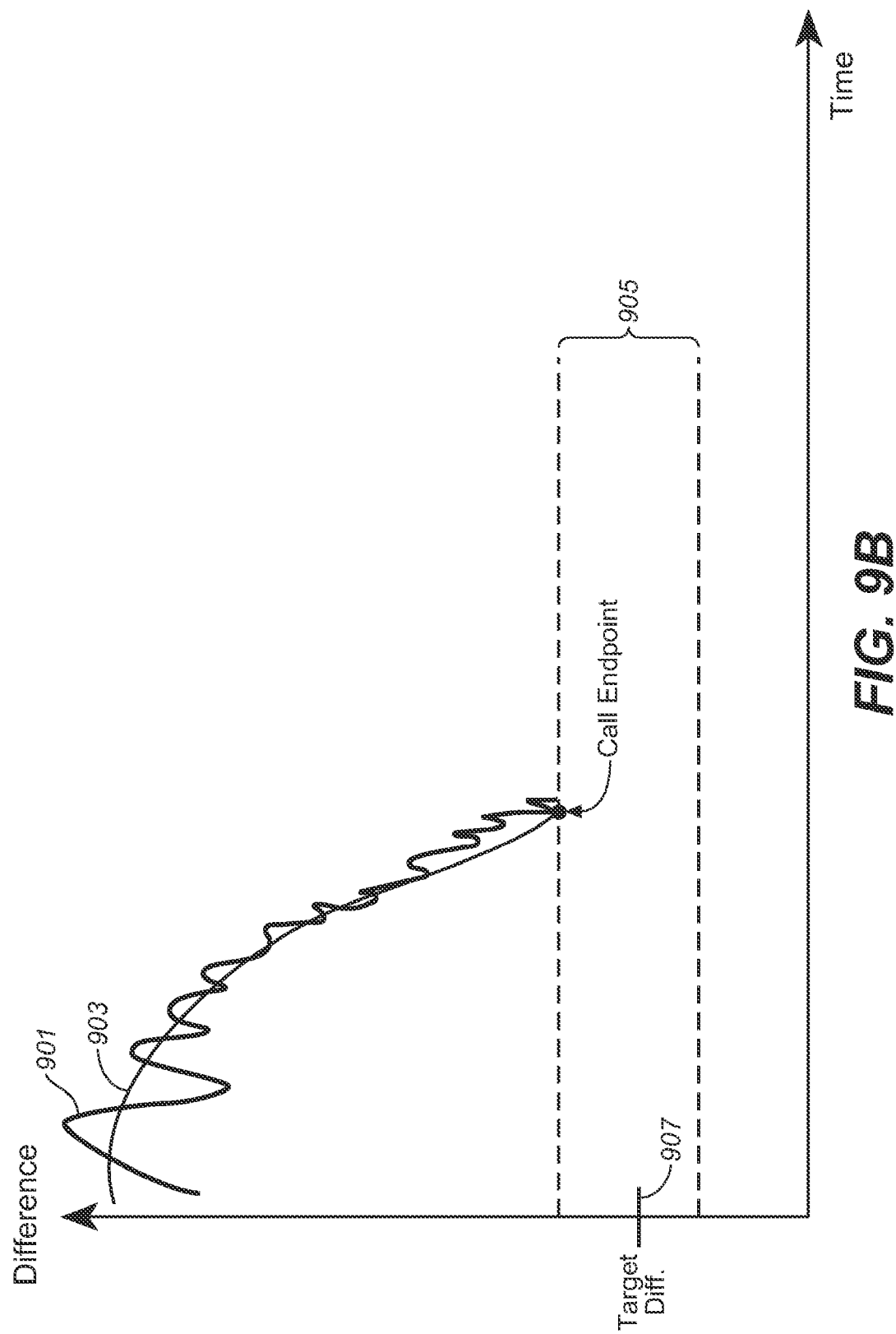

FIG. 9B illustrates the above described method for determining endpoint. Trace 901 is the raw difference trace. Trace 903 is the smoothed difference trace. Endpoint is called when the smooth difference trace 903 is within a threshold range 905 of a target difference 907.

FIG. 10A shows another method 1000 for determining an endpoint of a polishing step. A reference spectrum is obtained (step 1002). The reference spectrum is obtained as described above in reference to FIG. 7B.

The spectra collected from the process of obtaining the reference spectrum are stored in a library (step 1004). Alternatively, the library can include spectra that are not collected but theoretically generated. The spectra, including the reference spectrum, are indexed so that each spectrum has a unique index value. The library can be implemented in memory of the computing device of the polishing apparatus.

A substrate from the batch of substrates is polished, and the following steps are performed for each platen revolution. One or more spectra are measured to obtain a current spectra for a current platen revolution (step 1006). The spectra are obtained as described above. The spectra stored in the library which best fits the current spectra is determined (step 1008). The index of the library spectrum determined to best fits the current spectra is appended to an endpoint index trace (step 1010). Endpoint is called when the endpoint trace reaches the index of the reference spectrum (step 1012).

Figure 10B:
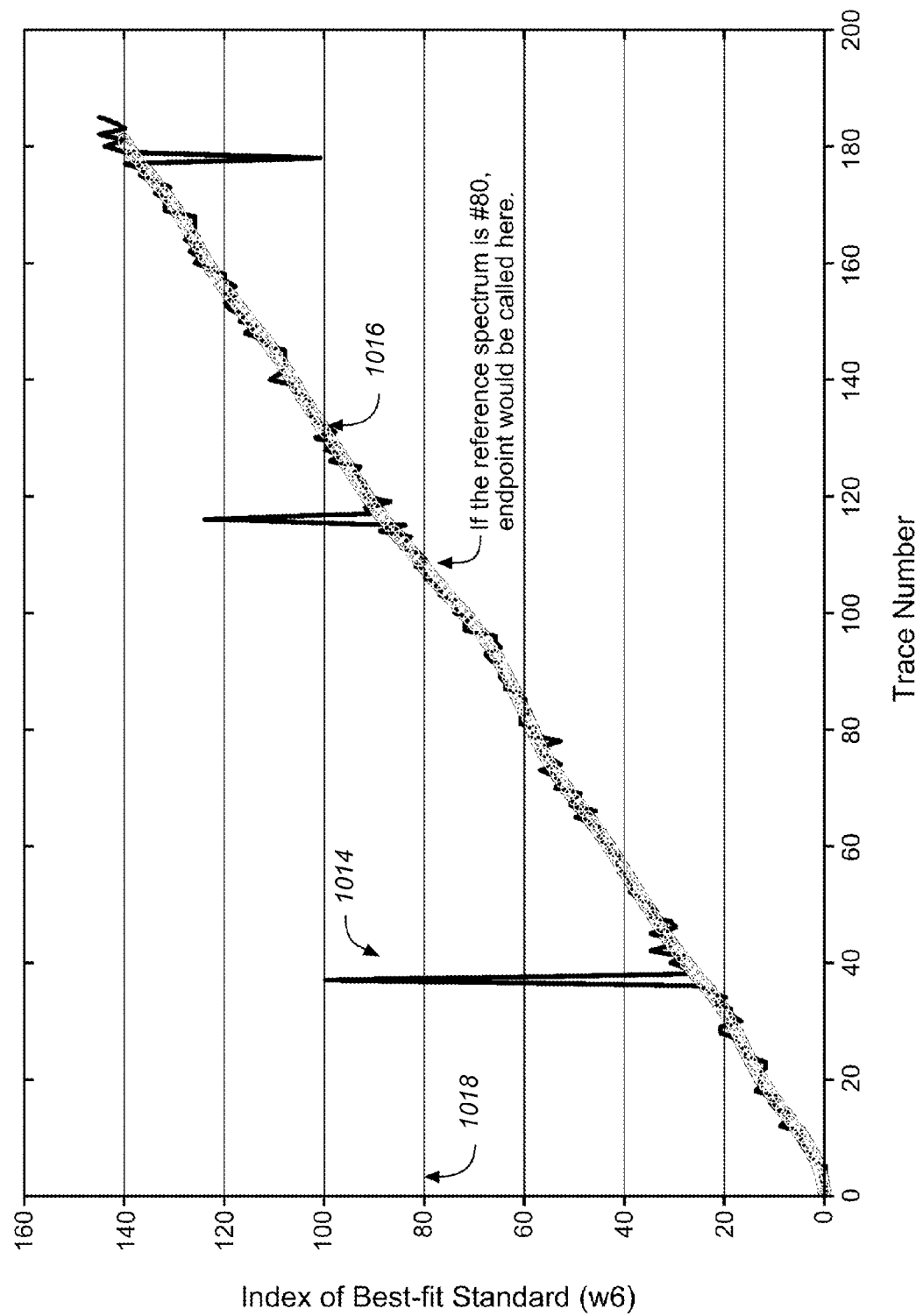

FIG. 10B illustrates the above described method for determining endpoint. Trace 1014 is the raw index trace. Trace 1016 is the smoothed difference trace. Line 1018 represents the index value of the reference spectrum. Multiple current spectra can be obtained in each sweep of the optical head beneath the substrate, e.g., a spectra for each radial zone on the substrate being tracked, and an index trace can be generated for each radial zone.

Figure 11:
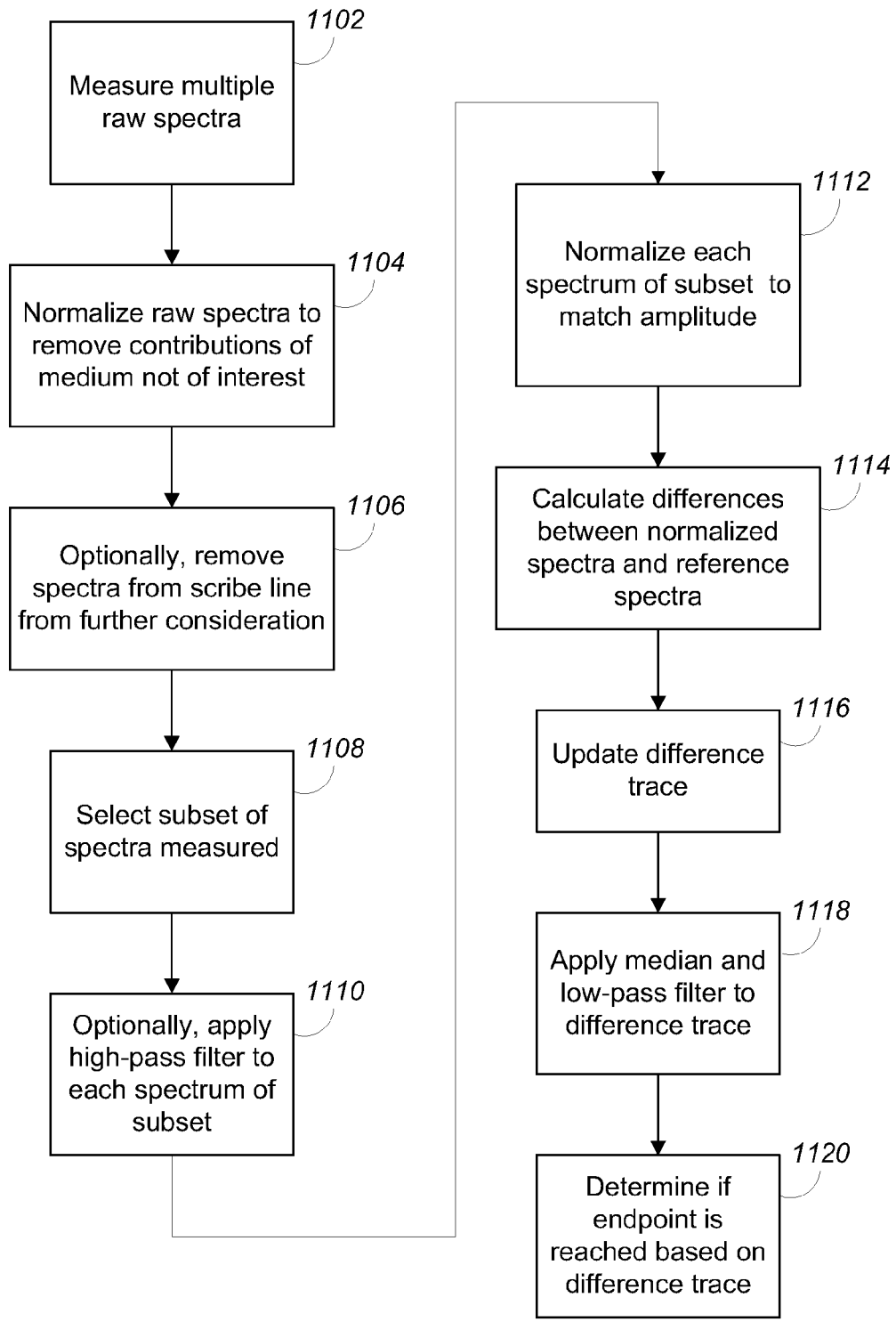
FIG. 11 shows an implementation for determining an endpoint.

FIG. 11 shows an implementation for determining an endpoint during a polishing step. For each platen revolution, the following steps are performed. Multiple raw spectra of white light reflecting off a substrate surface being polished are measured (step 1102).

Each measured raw spectra is normalized to remove light reflections contributed by mediums other than the film or films of interest (step 1104). Normalization of spectra facilitates their comparison to each other. Light reflections contributed by media other than the film or films of interest include light reflections from the polishing pad window and from the base silicon layer of the substrate. Contributions from the window can be estimated by measuring the spectrum of light received by the in situ monitoring system under a dark condition (i.e., when no substrates are placed over the in situ monitoring system). Contributions from the silicon layer can be estimated by measuring the spectrum of light reflecting of a bare silicon substrate. The contributions are usually obtained prior to commencement of the polishing step.

A measured raw spectrum is normalized as follows:

normalized spectrum=(*A*−Dark)/(*Si*−Dark)

where A is the raw spectrum, Dark is the spectrum obtained under the dark condition, and Si is the spectrum obtained from the bare silicon substrate.

Optionally, the collected spectra can be sorted based on the region of the pattern that has generated the spectrum, and spectra from some regions can be excluded from the endpoint calculation. In particular, spectra that are from light reflecting off scribe lines can be removed from consideration (step 1106). Different regions of a pattern substrate usually yield different spectra (even when the spectra were obtained at a same point of time during polishing). For example, a spectrum of the light reflecting off a scribe line in a substrate is different from the spectrum of the light reflecting off an array of the substrate. Because of their different shapes, use of spectra from both regions of the pattern usually introduces error into the endpoint determination. However, the spectra can be sorted based on their shapes into a group for scribe lines and a group for arrays. Because there is often greater variation in the spectra for scribe lines, usually these spectra can be excluded from consideration to enhance precision.

A subset of the spectra processed thus far is selected and averaged (step 1108). The subset consists of the spectra obtained from light reflecting off the substrate at points of a region on the substrate. The region can be, for example, region 512 or region 413 (FIG. 5).

Optionally, a high pass filter is applied to the measured raw spectra (step 1110). Application of the high pass filter typically removes low frequency distortion of the average of the subset of spectra. The high pass filter can be applied to the raw spectra, their average, or to both the raw spectra and their average.

The average is normalized so that its amplitude is the same or similar to the amplitude of the reference spectrum (step 1112). The amplitude of a spectrum is the peak to trough value of the spectrum. Alternatively, the average is normalized so that its reference spectrum is the same or similar to a reference amplitude to which the reference spectrum has also been normalized.

A difference between the normalized average and a reference spectrum is calculated (step 1114). The reference spectrum is obtained as described in reference to FIG. 7B. The difference is calculated using the above described equation for calculating differences between spectra.

A difference trace is updated with the current difference (step 1116). The difference trace exhibits calculated differences between normalized averages and the reference spectrum as a function of time (or platen revolution).

A median and low pass filter is applied to the updated difference trace (step 1118). Application of these filters typically smoothes the trace (by reducing or eliminating spikes in the trace).

Endpoint determination is performed based on the updated and filtered difference trace (step 1120). The determination is made based on when the difference trace reaches a minimum. The above described window logic is used to make the determination.

More generally, the signal processing steps of steps 1104-1112 can be used to improve endpoint determination procedures. For example, instead of generation of a difference trace, the normalized average spectra could be used to select a spectra from a library to generate an index trace, as described above in reference to FIG. 10A.

Figure 12:
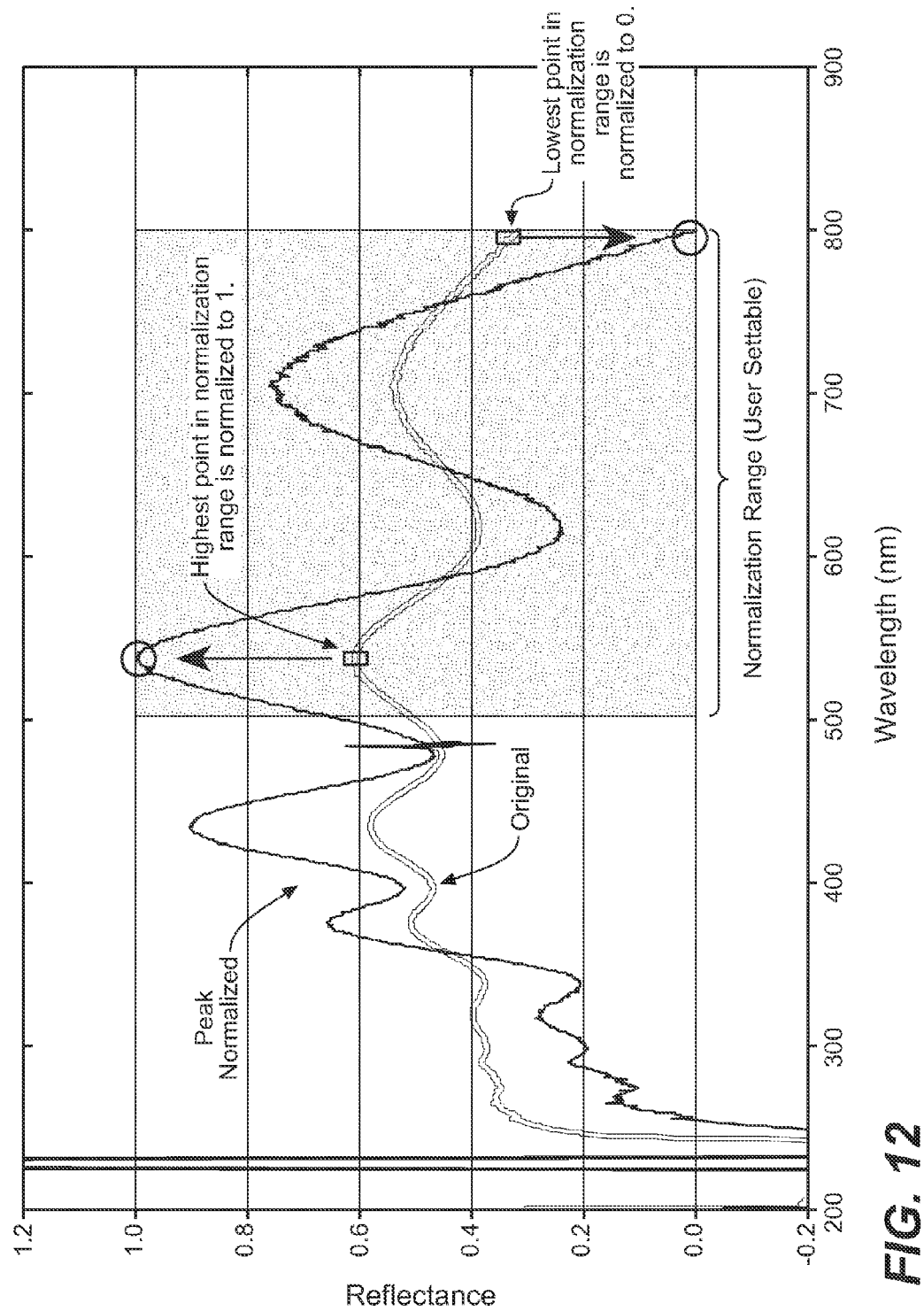
FIG. 12 illustrates peak to trough normalization of a spectrum.

FIG. 12 illustrates the normalization of step 1112. As can be seen, only a portion of a spectrum (or an average of spectra) is considered for normalization. The portion considered is referred to in the instant specification as a normalization range and, furthermore, can be user selectable. Normalization is effected so that the highest point and the lowest point in the normalization range are normalized to 1 and 0, respectively. The normalization is calculated as follows:

$$g=(1-0)/(r_{max}-r_{min})$$

$$h=1-r_{max} \cdot g$$

$$N=R \cdot g+h$$

where, g is a gain, h is an offset, $r_{max}$ is the highest value in the normalization range, $r_{min}$ is the lowest value in the normalization range, N is the normalized spectrum, and R is the pre normalized spectrum.

Figure 13:
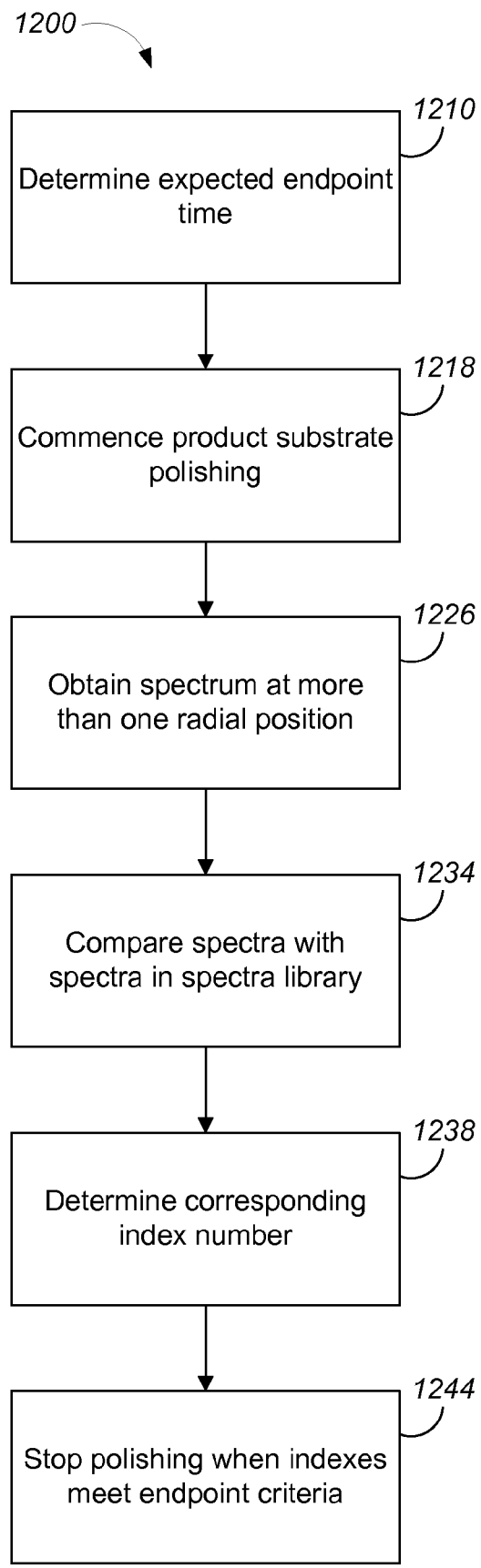
FIG. 13 shows a method for obtaining spectra within zones during polishing.

FIG. 13 shows a method 1200 for using spectra to achieve a desired substrate profile. An expected endpoint time for polishing a product substrate is determined (step 1210). In some implementations, the expected endpoint time is determined by polishing a set-up substrate with predetermined process parameters, determining when the set-up substrate reaches a desired thickness (e.g., by conventional off-line metrology measurements) and using the polishing time at which the set-up substrate reaches the desired thickness as the expected endpoint time.

Product substrate polishing commences (step 1218). A spectrum is obtained at more than one radial position of the substrate (step 1226). For each spectra measurement, the radial position on the substrate can be determined, and the spectra measurements can be binned into zones based on their radial positions. A substrate can have multiple zones, such as a center zone, a middle zone and an edge zone. On a 300 mm wafer, the center zone can extend from the center to a radius of 50 mm, the middle zone can extend from a radius of 50 mm to about 100 mm and the edge can extend from about 100 mm to about 150 mm. In some implementations, the substrate has more or fewer zones that the three mentioned. The position from which the spectra is obtained can be determined, such as by using the method described in U.S. Publication No. 2007/0224915, filed Aug. 18, 2004, "Determination of Position of Sensor Measurements During Polishing" or as described in U.S. Pat. No. 7,018,271, incorporated herein by reference for all purposes.

The spectra from each zone (or, for each zone, an average of spectra from within the zone obtained from a single sweep of the sensor across the substrate) are compared to the spectra in the spectra library, as described above with respect to FIG. 10A (step 1234). The corresponding index number is determined for each zone from the comparison with the spectra library (step 1238).

Polishing is stopped when the indexes for the zones meet one or more endpoint criteria. For example, polishing can be stopped when a desired index is reached for a preselected zone, or when any of the zones first reaches a desired index, or when desired indexes are achieved for every zone (step 1244). The desired index for each zone is determined by the final desired profile for the substrate. If the substrate is to have a flat profile or a uniform layer of oxide when polishing is completed, then spectra obtained at each zone should be the same or approximately the same and each zone would have the same or similar desired index number.

Figure 14:
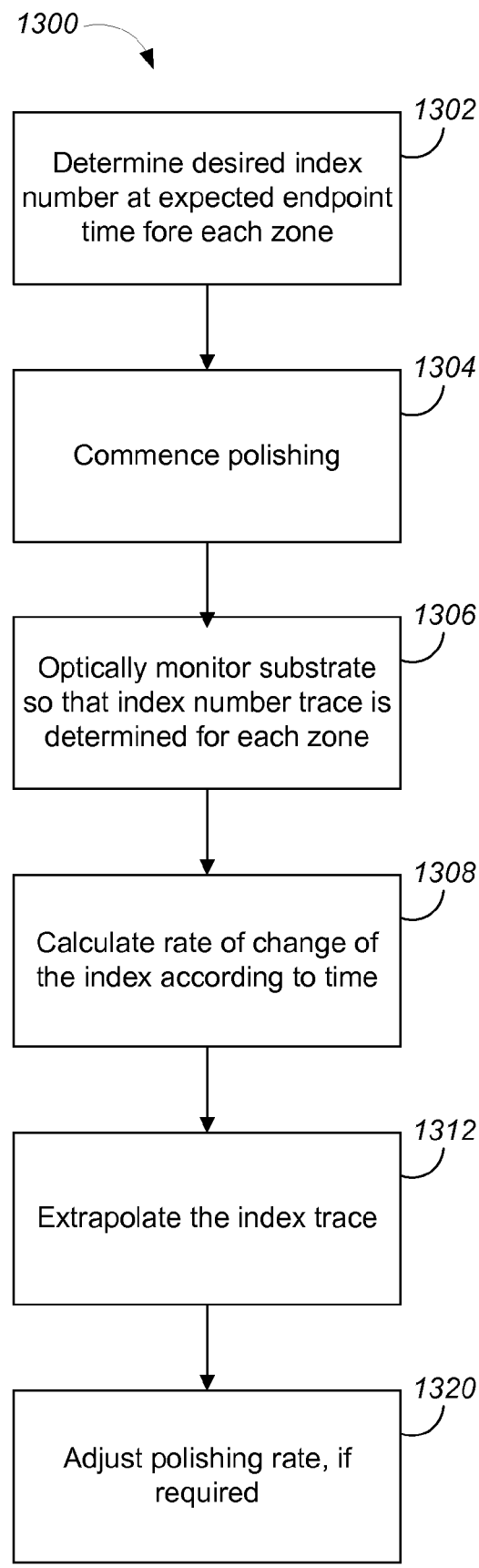
FIG. 14 shows a method for adjusting the polishing rate in zones to achieve a desired profile.

The polishing rates in the zones can be adjusted using a feedback loop so that the final index number in each zone is equal to the desired final index number. FIG. 14 shows one method 1300 for adjusting the polishing process to achieve the desired substrate profile at the expected endpoint time. The desired index number at the expected endpoint time is determined for each zone on the substrate (step 1302). Polishing commences (step 1304) and the substrate is optically monitored as described above so that an index trace is determined for each zone on the substrate (step 1306). After an initial delay time, which allows the polishing process to stabilize, the rate of change of the index according to time is calculated (number of platen rotations may be used as representative of the time) (step 1308). The rate of change of the index may be calculated simply as a difference in indexes at two different times divided by the number of elapsed platen rotations between the spectra measurements that generated the indexes at the different times. The rate of change in the index number indicates the polishing rate. Typically, if none of the polishing parameters are changed, the polishing rate can be assumed to be steady.

The rate of change of the index for each zone is used to extrapolate the index trace to determine the index number that will be achieved at the expected endpoint time for the associated zone (step 1312). If at the expected endpoint time, the desired index number will be passed or will not yet been reached, the polishing rate can be adjusted upwardly or downwardly, as required (step 1320). If the desired index number is reached at the expected endpoint time, no adjustment may be required. More than one extrapolation and determination of whether an adjustment should be made can occur over the polishing sequence. Determining whether an adjustment in the polishing rate needs to be made can include determining whether the desired index number will be achieved when the polishing endpoint occurs or determining that the final index falls within an acceptable range from the desired final index number.

In some implementations, the expected endpoint time is determined for one zone, such as the center zone. The polishing rates within the other zones are then adjusted, if necessary, to achieve their desired endpoints at the same time as the expected endpoint time for the selected zone, e.g., the center zone. The polishing rates can be adjusted, such as by increasing or decreasing the pressure in a corresponding zone in the carrier head. In some carrier heads, such as the carrier head described in U.S. Publication No. 2005-0211377, the carrier head has adjustable pressure zones. The change in polishing rate can be assumed to be directly proportional to the change in pressure, e.g., a simple Prestonian model. Additionally, a control model for polishing the substrates can be developed that takes into account the influences of platen or head rotational speed, second order effects of different head pressure combinations, the polishing temperature, slurry flow, or other parameters that affect the polishing rate.

The spectrum based endpoint determination logic described above in method 800, can also be used to determine the polishing endpoint and can be used in conjunction with adjusting the polishing process to achieve the desired substrate profile. The relative thickness for each zone is determined using the difference between the zones, from the equation provided above with respect to step 806. As the substrate is polished, spectra are obtained and binned into zones. Optionally, signal processing and filtering is applied to the spectra. A sum-of-squared-difference calculation is applied to the collected spectra for each zone and a predetermined reference spectrum. The predetermined reference spectrum is the spectrum that is obtained when the polishing endpoint has been reached.

When the sum-of-squared-difference with the reference spectrum approaches a minimum in one zone, the polishing pressures for the other zones are examined to determine if the polishing rates at any of the zones should altered. The polishing rate at the zone where the sum-of-squared-difference is approaching a minimum can be reduced and the polishing rates in the other zones can be increased. The sum-ofsquared-difference can also be analyzed throughout polishing so that adjustments to the polishing rate can be altered earlier in the polishing sequence. Unlike the method described in method 1300, this method does not require a correlation between the polishing spectra and index numbers from a spectra library.

Figure 15:
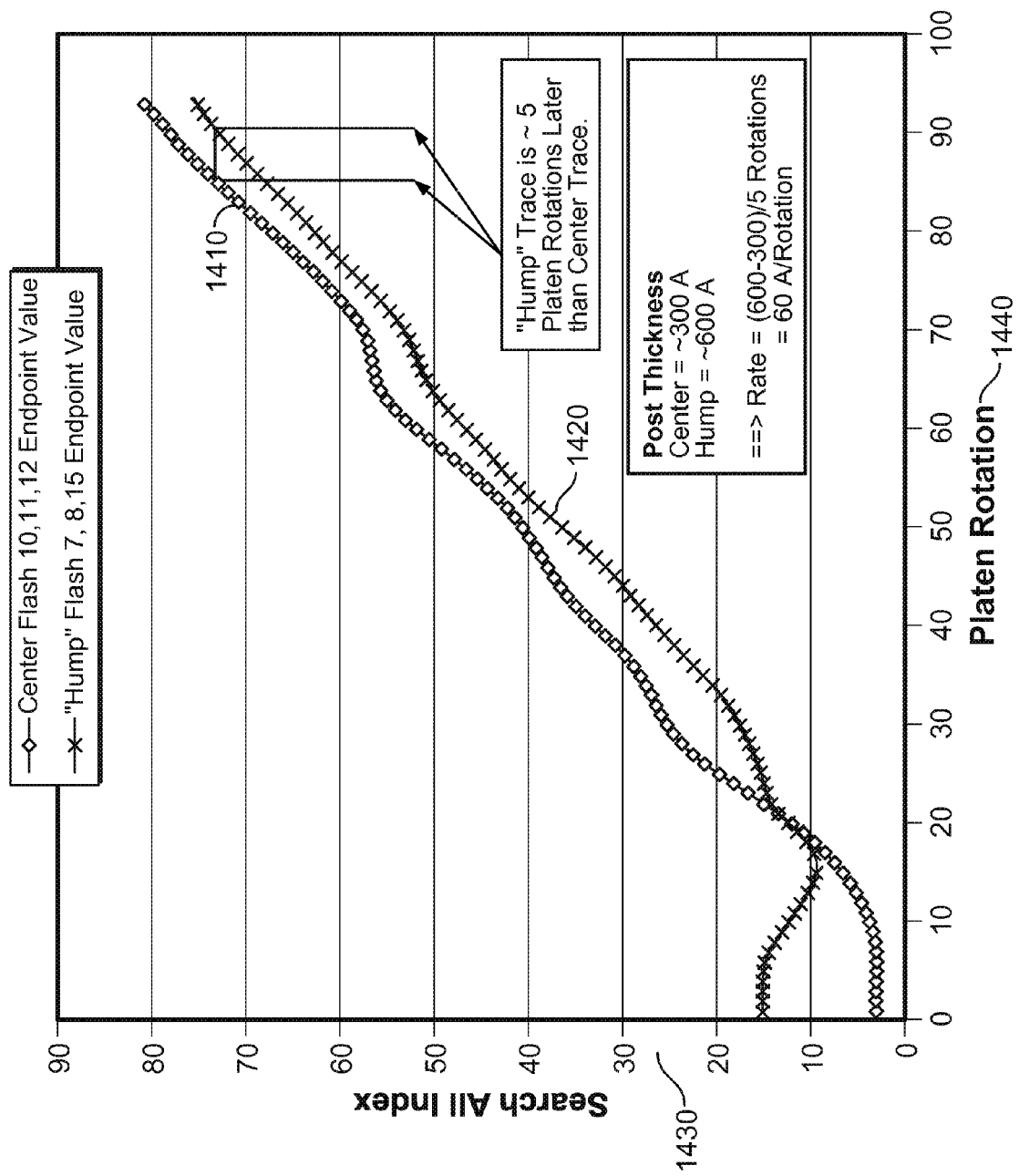
FIG. 15 shows a graph of the polishing progress (e.g., material removed or material remaining, as characterized by an index) versus time (as characterized by the number of platen rotations).

The polishing rate determinations described above can be graphically depicted. Referring to FIG. 15, the index corresponding to each spectra can be graphed as a function of the number of platen rotations. Here, a product substrate with a diameter of 300 mm was polished. The center region of the substrate is a circle that extends from the center to about 40 mm in radius. The edge region is between about 90 mm from the center to about 130 mm from the center. Line 1410 is based on spectra obtained from the center region of the substrate. Line 1420 is based on spectra obtained from the edge region of the substrate. The y axis corresponds to the index 1430, where the index numbers are between 0 and 90. The x-axis corresponds to the number of rotations 1440 at which a spectrum is obtained. After about the first 20 rotations, the spectra obtained at the center and the edge are about the same. The polishing process then begins to stabilize. At the end of the polishing cycle, the measured thickness of the substrate at the center is about 300 Angstroms greater than at the edge. A particular spectra is obtained from the edge zone about 5 rotations later than the same spectra is obtained from the center zone. Here, the polishing rates are about equal, as can be seen from the polishing rates being parallel. Thus, the difference in the final polishing thickness (300 Angstroms) divided by the number of rotations that the edge zone is ahead of the center zone (5 rotations) indicates the rate of polishing (about 60 Angstroms per rotation), once the polishing process stabilizes.

Figure 16:
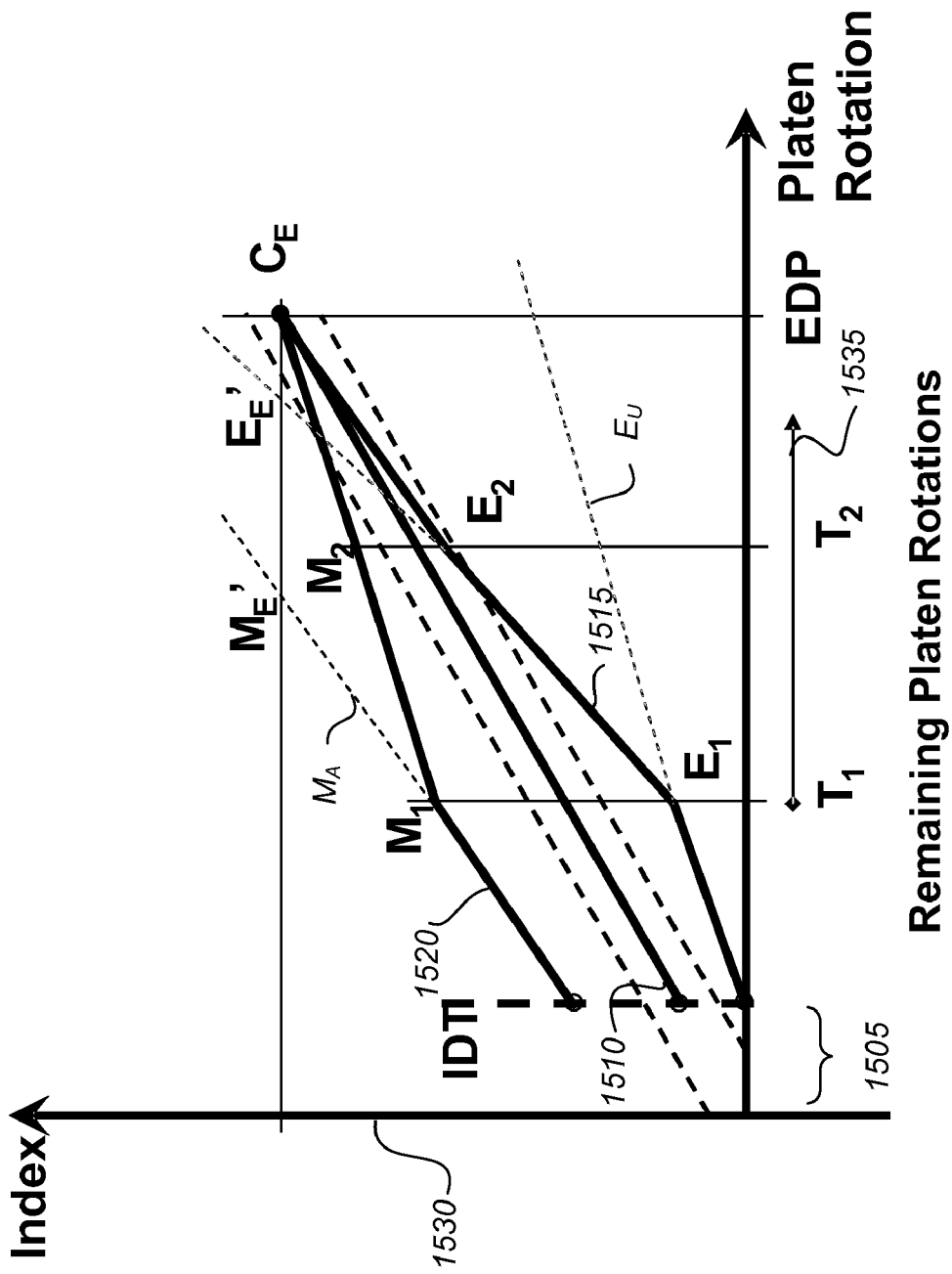
FIG. 16 shows a graph of the polishing progress versus time for a process in which the polishing rates are adjusted.

Referring to FIG. 16, if a particular profile is desired, such as a uniform thickness across the surface of the substrate, the slope of the polishing rate, as indicated by the change in index numbers according to time, can be monitored and the polishing rate adjusted. After a polishing stabilizing period 1505, a spectrum is obtained at the center zone 1510, at the edge zone 1515 and in between at a middle zone 1520. Here, the zones are circular or annular zones. Each spectrum is correlated to its respective index. This process is repeated over a number of platen rotations, or over time, and the polishing rate at each of the center zone 1510, middle zone 1520 and edge zone 1515 is determined. The polishing rate is indicated by the slope of the line that is obtained by plotting the index 1530 (y-axis) according to the number of rotations 1535 (x-axis). If any of the rates appears to be faster or slower than the others, the rate in the zone can be adjusted. Here, the adjustment is based on the endpoint $C_E$ of the center zone 1510. An approximate polish end point EDP is known from polishing similar substrates with similar polishing parameters or from using the difference method described above. At a first polishing time $T_1$ during the polishing process, the rate of polishing at the middle zone 1520 is decreased and the rate of polishing at the edge zone is increased. Without adjusting the polishing rate at the middle zone 1520, the middle zone would be polished faster than the rest of the substrate, being polished at an overpolish rate of $M_A$. Without adjusting the polishing rate at $T_1$ for the edge zone 1515, the edge zone 1515 would be underpolished at a rate of $E_u$.

At a subsequent time ($T_2$) during the polishing process, the rates can again be adjusted, if necessary. The goal in this polishing process is to end polishing when the substrate has a flat surface, or an oxide layer across the surface that is relatively even. One way of determining the amount to adjust the rate of polishing is to adjust the rates so that the index of each of the center, middle and edge zones are equal at the approximate polish end point EDP. Thus, the polishing rate at the edge zone needs adjusting while the center and middle zones are polished at the same rate as prior to $T_2$. If the EDP is approximate, polishing can be stopped when the index at each zone is in the desired location, that is, when each location has the same index.

Figure 17:
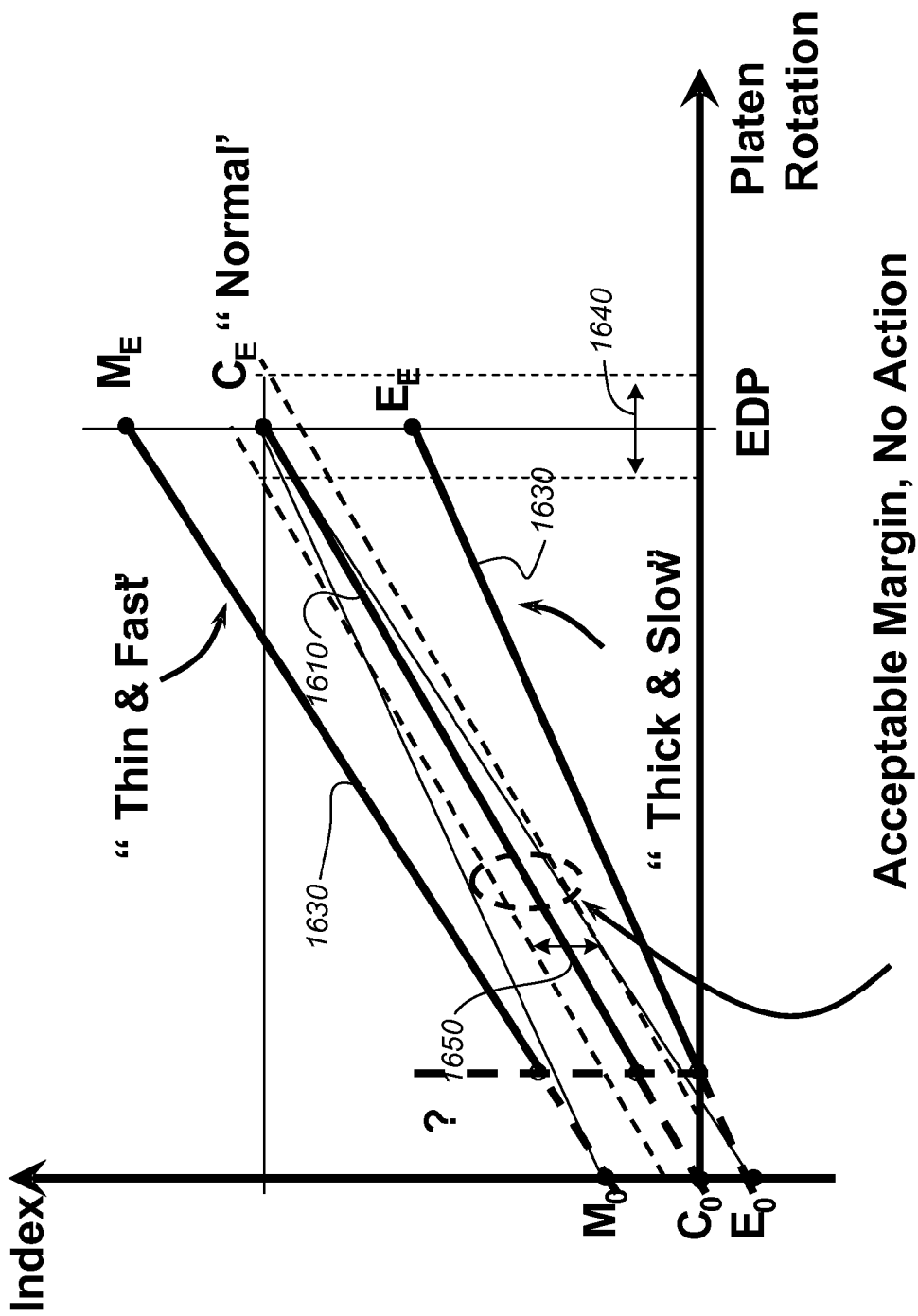
FIG. 17 shows a graph of the polishing progress versus time for a process in which the polishing rates are not adjusted.

Another way of using the spectra-based observation of the polishing rates to achieve a particular profile is to polish a first substrate and monitor the polishing rate and feed the polishing rate information forward to subsequently polished substrates. Referring to FIG. 17, a first set-up substrate is polished and spectra are obtained so that the polishing rates and relative oxide thickness at the center 1610, middle 1620 and edge zones 1630 are determined. The starting index for the middle 1620, center 1610 and edge 1630 zones is $M_O$, $C_O$ and $E_O$, respectively. The center zone 1610 has an endpoint $C_E$ spectra that is selected to be the target spectra. If at the end of polishing the other two zones have an index number that is within a threshold distance 1640 from the index of the center endpoint CE, no adjustments will be made to the polishing rate of the edge 1630 or middle zones 1620. Similarly, if the polishing rate and the index numbers during polishing are within an acceptable margin 1650, no adjustment will need to be made to the edge 1630 or middle zones 1620. Here, the endpoint for the middle zone $M_E$ shows that the middle zone has been over-polished and the endpoint for the edge zone $E_E$ shows that the edge zone has been under-polished.

Figure 18:
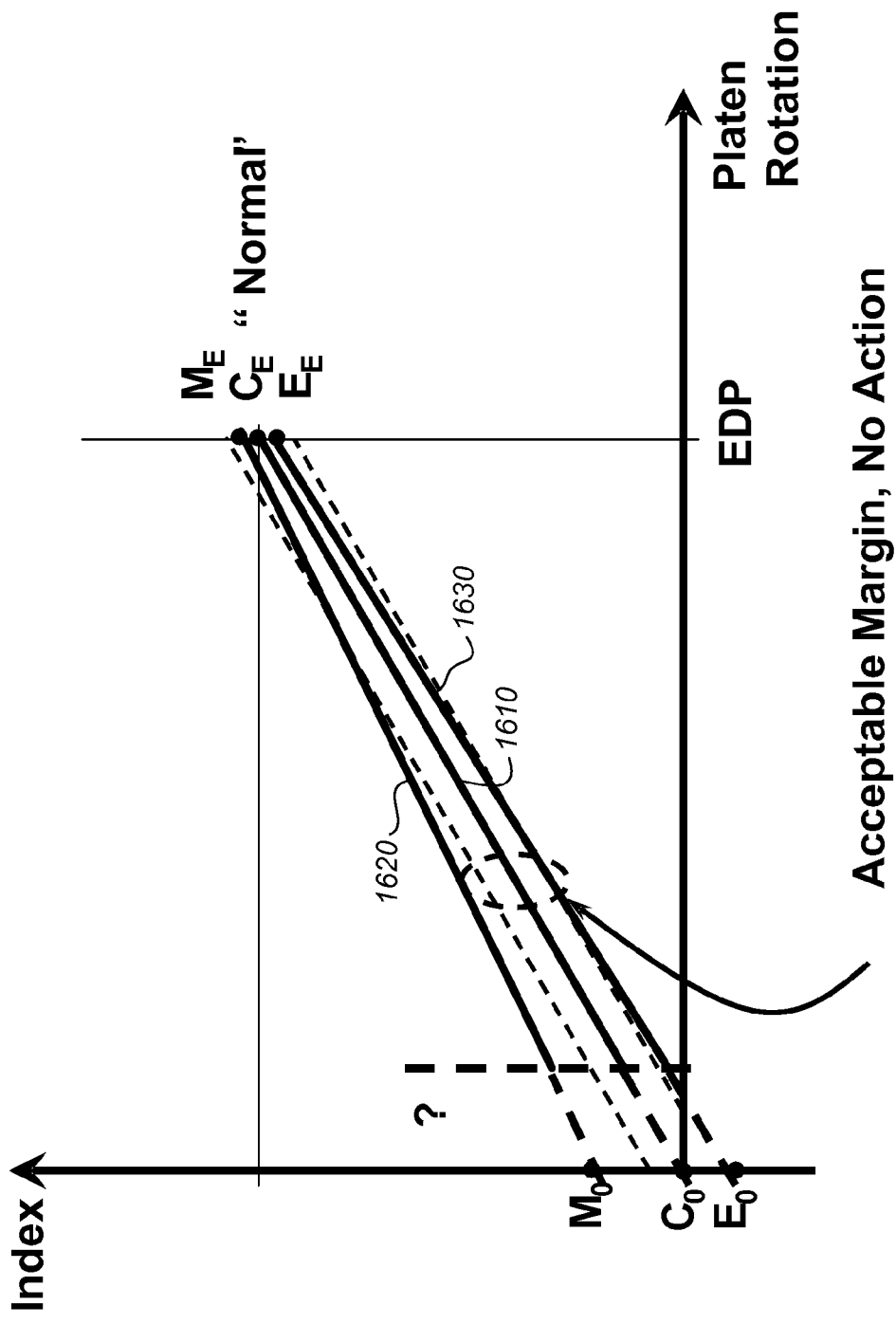
FIG. 18 shows a graph of the polishing versus time for a process that uses a feed forward method of controlling polishing.

Referring to FIG. 18, any required adjustments are made to the polishing rates and a product substrate is polished. Polishing of the product substrate can be monitored and fed into subsequent substrates. This can correct any drifting in polishing rates between polishing product substrates.

During the polishing process, it is preferred to only make changes in the polishing rates a few times, such as four, three, two or only one time. The adjustment can be made near the beginning, at the middle or toward the end of the polishing process. Associating the spectra with an index number creates a linear comparison for polishing at each of the zones and can simplify calculations required to determine how to control the polishing process and obviate complex software or processing steps.

In some polishing schemes, it is not important that the oxide is cleared from the substrate. Therefore, the expected endpoint time is only used as a guideline for when polishing should be stopped. As its name indicates, the estimated endpoint time can be used to estimate the polishing endpoint and the actual polishing endpoint can be called when the final desired profile for the substrate is detected using the optical monitoring system.

The spectra obtained from different zones of the substrate can indicate the profile of the substrate, but do not necessarily provide a precise thickness of the oxide layer. Thus, some of the spectra-based polishing rate adjustment methods described herein can be used to monitor the relative thicknesses of the oxide across the substrate. Because the spectra-based methods can be used to determine and adjust the polishing rates within zones of the substrate, the spectra-based methods can also compensate for the incoming thickness variation of the substrate, as well as polishing induced within wafer non-uniformity.

As described herein, the relative thickness can be used required to achieve the desired substrate profile. In some of the examples above, the desired substrate profile after polishing is a flat profile. However, a profile that is other than flat can also be achieved. Often, a substrate is polished on more than one platen. Some polishing processes are known to inherently polish one zone faster than another. To compensate for this non-uniform polishing, polishing at a first platen can be controlled to leave one zone thicker than another, such as the zone that will be polished faster on a subsequent platen. This difference in thickness can be achieved by selecting a difference in target index numbers or a ratio between an ending index number for one zone versus another.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine readable storage device or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier head, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims. For example, the methods described herein can be used for determining a polishing endpoint or for setting up and calibrating a polishing system prior to polishing actual wafers. The actions recited in the claims can be performed in a different order and still achieve desirable results.

What is claimed is:

1. A computer-implemented method, comprising:
   obtaining a first spectrum of reflected light from a first zone on a substrate and a second spectrum from a second zone on the substrate during a polishing sequence;
   comparing the first spectrum and the second spectrum to a spectra library to determine a first index for the first spectrum and a second index for the second spectrum;
   obtaining a third spectrum of reflected light from the first zone and a fourth spectrum from the second zone at a different time during the polishing sequence;
   comparing the third spectrum and the fourth spectrum to the library to determine a third index for the third spectrum and a fourth index for the fourth spectrum;
   determining a first polishing rate at the first zone from the first index and the third index and a second polishing rate at the second zone from the second index and the fourth index; and
   based on the first polishing rate, the second polishing rate, a first target relative thickness for the first zone and a second target relative thickness for the second zone, determining an adjusted polishing rate for the second zone to cause the second zone to be polished to the second target relative thickness at substantially the same time as the first zone is polished to the first target relative thickness.

2. The method of claim 1, wherein the first zone is an inner zone and the second zone is an outer annular zone.

3. The method of claim 1, wherein determining an adjusted polishing rate for the second zone includes determining when the first target relative thickness will be within a predetermined threshold from the second target relative thickness.

4. The method of claim 1, wherein determining an adjusted polishing rate for the second zone includes determining an estimated endpoint time for the polishing sequence.

5. The method of claim 1, wherein obtaining the first spectrum and a second spectrum includes obtaining white light spectra.

6. The method of claim 1, further comprising adjusting a parameter of the polishing system to cause the second zone to be polished at the adjusted polishing rate.

7. The method of claim 6, wherein the step of determining the adjusted polishing rate is performed on a set-up substrate and the step of adjusting a parameter of the polishing system is performed on a product substrate.

8. The method of claim 6, wherein the step of determining the adjusted polishing rate is performed on product substrate and the step of adjusting a parameter of the polishing system is performed on the product substrate.

9. The method of claim 6, wherein adjusting a parameter of the polishing system includes adjusting pressure.

10. The method of claim 1, wherein determining an adjusted polishing rate includes determining a rate of polishing which causes a cross section along a diameter of the substrate to have a flat profile when the polishing sequence is completed.

11. The method of claim 1, wherein determining an adjusted polishing rate includes determining a rate of polishing which causes a cross section along a diameter of the substrate to have a non-flat profile when the polishing sequence is completed.

12. The method of claim 1, wherein obtaining the first spectrum and the second spectrum includes sampling the substrate at different rotational locations.

13. The method of claim 1, wherein obtaining the first spectrum and the second spectrum includes measuring spectra reflected from an oxide layer.

14. The method of claim 1, further comprising:
polishing a set up substrate until the set up substrate is overpolished;
obtaining a plurality of spectra from a single zone of the test substrate during the polishing; and
storing the plurality of spectra in combination with a time at which each spectrum was obtained to create the spectra library.

15. The method of claim 14, further comprising creating indexes for the spectra library, wherein an index represents a spectrum obtained from the set up substrate at a specified time.

16. A system configured to perform the method of claim 1, comprising:
a light source;
a detector; and
a controller configured to perform the method of claim 1, including the steps of comparing the first spectrum and the second spectrum to a spectra library, comparing the third spectrum and the fourth spectrum to the library, determining a polishing rate and determining an adjusted polishing rate.

17. A method of monitoring a chemical mechanical polishing process, comprising:
directing a multi-wavelength light beam onto a substrate undergoing a polishing sequence and measuring a first spectrum of light reflected from the substrate;
causing the light beam to move in a path across the substrate surface;
after causing the light beam to move, directing the multi-wavelength light beam onto the substrate during the polishing sequence and measuring a second spectrum of light reflected from the substrate;
repeating the steps of directing the multi-wavelength light beam, causing the light beam to move in a path and after causing the light beam to move, directing the multi-wavelength light beam at a different time during the polishing sequence to measure a third spectrum of reflected light and a fourth spectrum of reflected light from the substrate;
determining a radial position on the substrate for each of the spectral measurements;
sorting the spectral measurements into a plurality of radial ranges according to the radial positions, wherein the first spectrum and the third spectrum correspond to a first radial range and the second spectrum and fourth spectrum correspond to a second radial range of the plurality of radial ranges;
comparing the spectral measurements to a spectra library to determine a first index for the first spectrum, a second index for the second spectrum, a third index for the third spectrum and a fourth index for the fourth spectrum;
determining a first polishing rate at the first radial range from the indices corresponding to the first radial range and a second polishing rate at the second radial range from the indices corresponding to the second radial range; and
based on the first polishing rate, the second polishing rate, a first target relative thickness for the first radial range and a second target relative thickness for the second radial range, determining an adjusted polishing rate for the second radial range to cause the second radial range to be polished to the second target relative thickness at substantially the same time as the first radial range is polished to the first target relative thickness.

18. The method of claim 17, further comprising applying the adjusted polishing rate to the one of the radial ranges.

19. A system for performing the method of claim 17, comprising:
a light source;
a detector; and
a controller configured to perform the steps of claim 17, including sorting the spectral measurements into a plurality of radial ranges and determining an adjusted polishing rate for the second radial range.

* * * * *